US012190816B2

(12) United States Patent
Feng et al.

(10) Patent No.: US 12,190,816 B2
(45) Date of Patent: Jan. 7, 2025

(54) DISPLAY SUBSTRATE, DISPLAY PANEL AND DISPLAY DEVICE

(71) Applicant: BOE Technology Group Co., Ltd., Beijing (CN)

(72) Inventors: Yu Feng, Beijing (CN); Jianchao Zhu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/556,403

(22) PCT Filed: Jan. 29, 2023

(86) PCT No.: PCT/CN2023/073647
§ 371 (c)(1),
(2) Date: Oct. 20, 2023

(87) PCT Pub. No.: WO2024/156106
PCT Pub. Date: Aug. 2, 2024

(65) Prior Publication Data
US 2024/0265870 A1    Aug. 8, 2024

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ............... H10K 59/131; G09G 3/3233; G09G 2310/08; G09G 2300/0861; G09G 2300/0842; G09G 2300/0426
See application file for complete search history.

(56) References Cited

U.S. PATENT DOCUMENTS 11,482,170 B2 * 10/2022 Feng ................... G09G 3/3233
11,963,407 B2 *  4/2024 Lu ........................ H10K 59/131
(Continued)

FOREIGN PATENT DOCUMENTS

CN        104599657 A      5/2015
CN        105045012 A     11/2015
(Continued)

*Primary Examiner* — Doon Y Chow
*Assistant Examiner* — Dennis Chow
(74) *Attorney, Agent, or Firm* — Westman, Champlin & Koehler, P.A.

(57) ABSTRACT

Provided are a display substrate, a display panel, and a display device. The display substrate includes a base substrate, pixel circuits, groups of data lines, and first power lines. At least one column of pixel circuits is electrically connected to at least one group of data lines and includes first and second pixel circuits alternately arranged in the second direction. The at least one group of data lines includes first and second data lines. For the at least one column of pixel circuits, input transistors of first and second pixel circuits are electrically connected to first and second data lines, respectively. In the first direction, the first data line, the first power line and the second data line are arranged in sequence, and input transistors of first and second pixel circuits are respectively located on a side of the first power line close to the first and second data line.

20 Claims, 22 Drawing Sheets

(52) U.S. Cl.
CPC ............... *G09G 2300/0842* (2013.01); *G09G 2300/0861* (2013.01); *G09G 2310/08* (2013.01)

(56) References Cited

U.S. PATENT DOCUMENTS

| | | |
|---|---|---|
| 11,978,396 B2 * | 5/2024 | Liu ..................... G09G 3/3233 |
| 12,004,389 B2 * | 6/2024 | Yang ................... G09G 3/3233 |
| 2018/0157135 A1 | 6/2018 | Wang et al. |
| 2020/0243633 A1 * | 7/2020 | Kang ................... H10K 59/131 |
| 2021/0280659 A1 * | 9/2021 | Park .................... G09G 3/3233 |
| 2022/0199707 A1 | 6/2022 | Park |

FOREIGN PATENT DOCUMENTS

| | | |
|---|---|---|
| CN | 106652965 A | 5/2017 |
| CN | 113611247 A | 11/2021 |
| CN | 114203784 A | 3/2022 |
| CN | 114664894 A | 6/2022 |
| CN | 115377165 A | 11/2022 |
| JP | 2009025453 A | 2/2009 |
| KR | 10-2008-0089747 A | 10/2008 |

\* cited by examiner

DISPLAY SUBSTRATE, DISPLAY PANEL AND DISPLAY DEVICE

CROSS REFERENCE TO RELATED APPLICATION(S)

This application is a Section 371 National Stage Application of International Application No. PCT/CN2023/073647, filed on Jan. 29, 2023, entitled "DISPLAY SUBSTRATE, DISPLAY PANEL AND DISPLAY DEVICE", the whole disclosure of which is incorporated herein by reference in its entirety.

TECHNICAL FIELD

The present disclosure relates to the field of display technology, and in particular, to a display substrate, a display panel and a display device.

BACKGROUND

With the continuous development of display technology, Active-Matrix Organic Light-Emitting Diode (AMOLED) display technology has been increasingly applied in display devices such as mobile phones, tablet computers, and digital cameras, etc., due to its advantages of self-illumination, wide viewing angle, high contrast, low power consumption, and high response speed, etc.

SUMMARY

The present disclosure provides a display substrate, a display panel, and a display device.

In a first aspect of the present disclosure, a display substrate is provided, including: a base substrate; a plurality of pixel circuits provided on the base substrate, the plurality of pixel circuits are arranged in an array in a first direction and a second direction: a plurality of groups of data lines provided on the base substrate, the plurality of groups of data lines are arranged in the first direction, and at least one column of pixel circuits is electrically connected to at least one group of data lines; and a plurality of first power lines provided on the base substrate, the plurality of first power lines are arranged in the first direction, and at least one column of pixel circuits is electrically connected to at least one first power line: the at least one column of pixel circuits includes a first pixel circuit and a second pixel circuit alternately arranged in the second direction, each of the first pixel circuit and the second pixel circuit includes an input transistor, and the at least one group of data lines includes a first data line and a second data line: for the at least one column of pixel circuits, the data lines electrically connected to the column of pixel circuits, and the first power line electrically connected to the column of pixel circuits, the input transistor of the first pixel circuit is electrically connected to the first data line, and the input transistor of the second pixel circuit is electrically connected to the second data line; and an orthographic projection of the first data line on the base substrate, an orthographic projection of the first power line on the base substrate and an orthographic projection of the second data line on the base substrate are arranged in sequence in the first direction, an orthographic projection of the input transistor of the first pixel circuit on the base substrate is located on a side of the orthographic projection of the first power line on the base substrate close to the orthographic projection of the first data line on the base substrate, and an orthographic projection of the input transistor of the second pixel circuit on the base substrate is located on a side of the orthographic projection of the first power line on the base substrate close to the orthographic projection of the second data line on the base substrate.

According to embodiments of the present disclosure, the display substrate further includes at least one first scanning signal line, and at least one pixel circuit in the plurality of pixel circuits further includes a driving transistor and a storage capacitor: in the at least one pixel circuit, a first electrode of the input transistor is electrically connected to the data line, a gate electrode of the input transistor is electrically connected to the at least one first scanning signal line, a first electrode of the driving transistor is electrically connected to a second electrode of the input transistor, a second electrode of the driving transistor is electrically connected to a first electrode of a light emitting device, a gate electrode of the driving transistor is electrically connected to a first electrode plate of the storage capacitor through a first connecting hole, and a second electrode plate of the storage capacitor is electrically connected to the first power line; and for the at least one column of pixel circuits, the input transistor of the first pixel circuit after being translated in the second direction is mirror symmetrical with the input transistor of the second pixel circuit about a first axis, the first axis extends in the second direction, and the first connecting hole is located on the first axis.

According to embodiments of the present disclosure, for the at least one column of pixel circuits, the data lines electrically connected to the column of pixel circuits, and the first power line electrically connected to the column of pixel circuits, in the first direction, the orthographic projection of the input transistor of the first pixel circuit on the base substrate is located on a side of an orthographic projection of the driving transistor of the first pixel circuit on the base substrate close to the orthographic projection of the first data line on the base substrate, and the orthographic projection of the input transistor of the second pixel circuit on the base substrate is located on a side of an orthographic projection of the driving transistor of the second pixel circuit on the base substrate close to the orthographic projection of the second data line on the base substrate.

According to embodiments of the present disclosure, the display substrate further includes at least one first reset signal line and at least one second scanning signal line, and the at least one pixel circuit further includes a first reset transistor; in the at least one pixel circuit, the first reset transistor includes a first electrode electrically connected to the at least one first reset signal line, a second electrode electrically connected to the gate electrode of the driving transistor, and a gate electrode electrically connected to the at least one second scanning signal line; and for the at least one column of pixel circuits, the first reset transistor of the first pixel circuit after being translated in the second direction is mirror symmetrical with the first reset transistor of the second pixel circuit about the first axis.

According to embodiments of the present disclosure, in the at least one pixel circuit, the first electrode of the first reset transistor and the gate electrode of the first reset transistor are located on the first axis.

According to embodiments of the present disclosure, the at least one pixel circuit further includes a threshold compensation transistor: in the at least one pixel circuit, the threshold compensation transistor includes a first electrode electrically connected to the second electrode of the driving transistor, a second electrode electrically connected to the gate electrode of the driving transistor, and a gate electrode electrically connected to the first scanning signal line; and for the at least one column of pixel circuits, the data lines electrically connected to the column of pixel circuits, and the first power line electrically connected to the column of pixel circuits, an orthographic projection of at least part of the threshold compensation transistor of the first pixel circuit on the base substrate is located between the orthographic projection of the first power line on the base substrate and the orthographic projection of the second data line on the base substrate, and an orthographic projection of at least part of the threshold compensation transistor of the second pixel circuit on the base substrate is located between the orthographic projection of the first power line on the base substrate and the orthographic projection of the first data line on the base substrate.

According to embodiments of the present disclosure, the at least one pixel circuit further includes a shielding electrode; and for the at least one pixel circuit and the data line electrically connected to the at least one pixel circuit, an orthographic projection of the shielding electrode on the base substrate is located between the orthographic projection of the first data line on the base substrate and the orthographic projection of the threshold compensation transistor on the base substrate, and a layer where the shielding electrode is located is between a layer where the data line is located and a layer where the threshold compensation transistor is located.

According to embodiments of the present disclosure, for the at least one column of pixel circuits, the threshold compensation transistor of the first pixel circuit after being translated in the second direction is mirror symmetrical with the threshold compensation transistor of the second pixel circuit about the first axis.

According to embodiments of the present disclosure, the display substrate further includes a plurality of light emission control signal lines, and the at least one pixel circuit further includes a first light emission control transistor: in the at least one pixel circuit, the first light emission control transistor includes a first electrode electrically connected to the second electrode of the driving transistor, a second electrode electrically connected to the first electrode of the light emitting device, and a gate electrode electrically connected to at least one light emission control signal line in the plurality of light emission control signal lines; and for the at least one column of pixel circuits, the data lines electrically connected to the column of pixel circuits, and the first power line electrically connected to the column of pixel circuits, an orthographic projection of the first light emission control transistor of the first pixel circuit on the base substrate is located between the orthographic projection of the first power line on the base substrate and the orthographic projection of the second data line on the base substrate, and an orthographic projection of the first light emission control transistor of the second pixel circuit on the base substrate is located between the orthographic projection of the first power line on the base substrate and the orthographic projection of the first data line on the base substrate.

According to embodiments of the present disclosure, for the at least one column of pixel circuits, the first light emission control transistor of the first pixel circuit after being translated in the second direction is mirror symmetrical with the first light emission control transistor of the second pixel circuit about the first axis.

According to embodiments of the present disclosure, at least one sub-pixel further includes a second light emission control transistor, and in the at least one sub-pixel, the second light emission control transistor includes a first electrode electrically connected to the at least one first power line, a second electrode electrically connected to the first electrode of the driving transistor, and a gate electrode electrically connected to the light emission control signal line; and for the at least one column of pixel circuits, the second light emission control transistor of the first pixel circuit after being translated in the second direction is mirror symmetrical with the second light emission control transistor of the second pixel circuit about the first axis.

According to embodiments of the present disclosure, the at least one pixel circuit further includes a transfer portion: for the at least one pixel circuit and the first power line electrically connected to the at least one pixel circuit, the second electrode of the first light emission control transistor is electrically connected to the first electrode of the light emitting device through the transfer portion; and for the at least one column of pixel circuits, the data lines electrically connected to the column of pixel circuits, and the first power line electrically connected to the column of pixel circuits, an orthographic projection of the transfer portion of the first pixel circuit on the base substrate is located on a side of the orthographic projection of the first power line on the base substrate close to the orthographic projection of the second data line on the base substrate, and an orthographic projection of the transfer portion of the second pixel circuit on the base substrate is located on a side of the orthographic projection of the first power line on the base substrate close to the orthographic projection of the first data line on the base substrate.

According to embodiments of the present disclosure, the display substrate further includes at least one second reset signal line and at least one third scanning signal line, and at least one sub-pixel further includes a second reset transistor: in the at least one pixel circuit, the second reset transistor includes a first electrode electrically connected to the at least one second reset signal line, a second electrode electrically connected to the first electrode of the light emitting device, and a gate electrode electrically connected to the at least one third scanning signal line; and for the at least one column of pixel circuits, the data lines electrically connected to the column of pixel circuits, and the first power line electrically connected to the column of pixel circuits, an orthographic projection of the second reset transistor of the first pixel circuit on the base substrate is located between the orthographic projection of the first power line on the base substrate and the orthographic projection of the second data line on the base substrate, and an orthographic projection of the second reset transistor of the second pixel circuit on the base substrate is located between the orthographic projection of the first power line on the base substrate and the orthographic projection of the first data line on the base substrate.

According to embodiments of the present disclosure, for the at least one column of pixel circuits, the second reset transistor of the first pixel circuit after being translated in the second direction is mirror symmetrical with the second reset transistor of the second pixel circuit about the first axis.

According to embodiments of the present disclosure, the display substrate further includes at least one third reset signal line and at least one third scanning signal line, and at least one sub-pixel further includes a third reset transistor: in the at least one pixel circuit, the third reset transistor includes a first electrode electrically connected to the at least one third reset signal line, a second electrode electrically connected to the first electrode of the driving transistor, and a gate electrode electrically connected to the at least one third scanning signal line; and for the at least one column of pixel circuits, the data lines electrically connected to the column of pixel circuits, and the first power line electrically connected to the column of pixel circuits, an orthographic projection of the third reset transistor of the first pixel circuit on the base substrate is located between the orthographic projection of the first power line on the base substrate and the orthographic projection of the first data line on the base substrate, and an orthographic projection of the third reset transistor of the second pixel circuit on the base substrate is located between the orthographic projection of the first power line on the base substrate and the orthographic projection of the second data line on the base substrate.

According to embodiments of the present disclosure, for the at least one column of pixel circuits, the third reset transistor of the first pixel circuit after being translated in the second direction is mirror symmetrical with the third reset transistor of the second pixel circuit about the first axis.

According to embodiments of the present disclosure, the at least one pixel circuit further includes a threshold compensation transistor, and the display substrate further includes a first shielding layer on a side of a layer where the input transistor is located close to the base substrate, and an orthographic projection of the first shielding layer on the base substrate covers the orthographic projection of the driving transistor of the at least one pixel circuit on the base substrate, the orthographic projection of the first reset transistor of the at least one pixel circuit on the base substrate, and the orthographic projection of the threshold compensation transistor of the at least one pixel circuit on the base substrate.

According to embodiments of the present disclosure, the at least one data line includes a first portion and a second portion, an orthographic projection of the second portion on the base substrate overlaps at least partially with an orthographic projection of at least one signal line extending in the first direction on the base substrate, and a size of the first portion in the first direction is greater than a size of the second portion in the first direction.

In a second aspect of the present disclosure, a display substrate is provided, including: a base substrate: a plurality of pixel circuits provided on the base substrate, the plurality of pixel circuits are arranged in an array in a first direction and a second direction; and a plurality of groups of data lines provided on the base substrate, the plurality of groups of data lines are arranged in the first direction, at least one column of pixel circuits is electrically connected to at least one group of data lines, and different columns of pixel circuits are electrically connected to different groups of data lines: at least one pixel circuit in the plurality of pixel circuits includes an input transistor and a driving transistor electrically connected to the input transistor, the at least one column of pixel circuits includes a first pixel circuit and a second pixel circuit alternately arranged in the second direction, and the at least one group of data lines includes a first data line and a second data line arranged in the first direction; and for the at least one column of pixel circuits, the data lines electrically connected to the column of pixel circuits, and a first power line electrically connected to the column of pixel circuits, the input transistor of the first pixel circuit is electrically connected to the first data line, the input transistor of the second pixel circuit is electrically connected to the second data line, and in the first direction, an orthographic projection of the input transistor of the first pixel circuit on the base substrate is located on a side of an orthographic projection of the driving transistor of the first pixel circuit on the base substrate close to an orthographic projection of the first data line on the base substrate, and an orthographic projection of the input transistor of the second pixel circuit on the base substrate is located on a side of an orthographic projection of the driving transistor of the second pixel circuit on the base substrate close to an orthographic projection of the second data line on the base substrate.

In a third aspect of the present disclosure, a display panel is provided, including the display substrate as described above.

In a fourth aspect of the present disclosure, a display device is provided, including the display panel as described above.

BRIEF DESCRIPTION OF THE DRAWINGS

The above contents and other objectives, features and advantages of the present disclosure will be more apparent through the following descriptions of embodiments of the present disclosure with reference to the accompanying drawings. In the accompanying drawings.

DETAILED DESCRIPTION OF EMBODIMENTS

Figure 1:
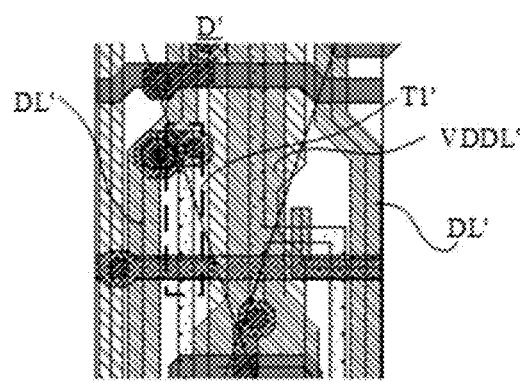
FIG. 1 and FIG. 2 schematically show schematic diagrams of pixel circuits in a display substrate in an example.

In order to make objectives, technical solutions and advantages of embodiments of the present disclosure clearer, technical solutions of embodiments of the present disclosure will be clearly and completely described below with reference to the accompanying drawings. Obviously, the described embodiments are just some embodiments rather than all embodiments of the present disclosure. Based on described embodiments of the present disclosure, all additional embodiments obtained by those ordinary skilled in the art without carrying out inventive effort fall within the scope of protection of the present disclosure.

It should be noted that in the accompanying drawings, for clarity and/or description purposes, sizes and relative sizes of an elements may be enlarged. Accordingly, the size and relative size of each element need not to be limited to those shown in the FIG.s. In the specification and the accompanying drawings, the same or similar reference numerals indicate the same or similar components.

When an element is described as being "on", "connected to" or "coupled to" another element, the element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent to" and "directly adjacent to", "on" and "directly on", and so on, should be interpreted in a similar manner. Moreover, the term "connection" may refer to a physical connection, an electrical connection, a communicative connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the purpose of the present disclosure, "at least one selected from X, Y or Z" and "at least one selected from a group consisting of X, Y and Z" may be interpreted as only X, only Y, only Z, or any combination of two or more of X, Y and Z, such as XYZ, XY, YZ and ZZ. As used herein, the term "and/or" includes any and all combinations of one or more of the listed related items.

It should be noted that although the terms "first", "second", and so on may be used here to describe various components, members, elements, regions, layers and/or portions, these components, members, elements, regions, layers and/or portions should not be limited by these terms. Rather, these terms are used to distinguish one component, member, element, region, layer and/or portion from another. Thus, for example, a first component, a first member, a first element, a first region, a first layer and/or a first portion discussed below may be referred to as a second component, a second member, a second element, a second region, a second layer and/or a second portion without departing from teachings of the present disclosure.

For ease of description, spatial relationship terms such as "upper", "lower", "left", "right", etc., may be used here to describe a relationship between an element or feature and another element or feature as shown in the drawings. It should be understood that the spatial relationship terms are intended to cover other different orientations of a device in use or operation in addition to the orientation described in the drawings. For example, if a device in the drawing is turned upside down, an element or feature described as "below" or "under" another element or feature will be oriented "above" or "on" the another element or feature.

Herein, the terms "substantially", "about", "approximately" and other similar terms are used as terms of approximation rather than terms of degree, and they are intended to explain an inherent deviation of a measured or calculated value that will be recognized by those ordinary skilled in the art. Taking into account process fluctuations, measurement problems, errors related to a measurement of a specific quantity (that is, a limitation of a measurement system) and other factors, the term "about" or "approximately" used here includes a stated value and means that a specific value determined by those ordinary skilled in the art is within an acceptable range of deviation. For example, "about" may mean being within one or more standard deviations, or within ±30%, ±20%, ±10% or ±5% of the stated value.

It should be noted that the expression "the same layer" herein refers to a layer structure that is formed by firstly forming, using one and same film forming process, a film layer used to form a specific pattern, and then patterning, using one-time patterning process, the film layer with one and same mask. Depending on different specific patterns, the one-time patterning process may include a plurality of exposure, development or etching processes, and the specific pattern in the formed layer structure may be continuous or discontinuous. That is, a plurality of elements, components, structures and/or portions located in the "same layer" are made of the same material and formed by one and same patterning process. Generally, a plurality of elements, components, structures and/or portions located in the "same layer" have substantially the same thickness.

Those skilled in the art should understand that, unless otherwise specified, the expression "height" or "thickness" herein refers to a size in a direction perpendicular to a surface of each film layer provided on the display substrate, that is, a size in a light emitting direction of the display substrate, or it may be referred to as a size in a normal direction of a display device.

Figure 2:
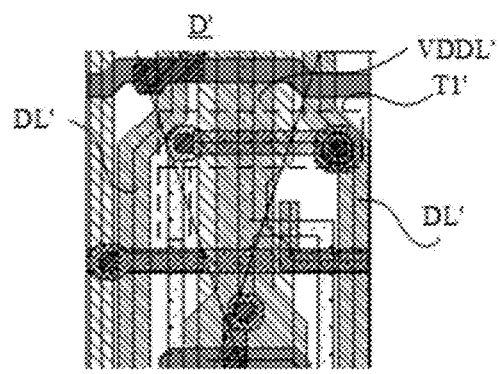

FIG. 1 and FIG. 2 schematically show schematic diagrams of pixel circuits in a display substrate in an example, where FIG. 1 schematically shows a partial schematic diagram of a pixel circuit in an odd row, and FIG. 2 schematically shows a partial schematic diagram of a pixel circuit in an even row. Referring to FIG. 1 and FIG. 2, in order to achieve a high frequency driving, a technical solution of dual data lines DL' (dual source) is adopted in such example, that is, two data lines DL' are used to provide data signals to a column of pixel circuits. In such example, a pixel circuit D' in an odd row and a pixel circuit D' in an even row are electrically connected to different data lines DL'. For example, an input transistor T1' of the pixel circuit D' in the odd row is electrically connected to a left data line DL', and an input transistor T1' of the pixel circuit D' in the even row is electrically connected to a right data line DL'. Such technical solution may be implemented to solve a problem of insufficient compensation time in a high frequency display, so that a high frequency (such as 120 Hz) driving may be achieved while ensuring a display effect.

However, as the pixel circuit D' in the odd row and the pixel circuit D' in the even row are electrically connected to different data lines DL', a layout design of the pixel circuit D' in the odd row is not completely consistent with a layout design of the pixel circuit D' in the even row, which may cause a difference between a parasitic capacitance of the pixel circuit D' in the odd row and a parasitic capacitance of the pixel circuit D' in the even row, thereby causing a difference between a brightness of a light emitting device driven by the pixel circuit D' in the odd row and a brightness of a light emitting device driven by the pixel circuit D' in the even row, thus resulting in a horizontal stripes mura.

For example, different from the pixel circuit D' in the odd row, the input transistor T1' of the pixel circuit D' in the even row needs to cross a signal line such as a first power line VDDL' before being electrically connected to the data line DL', which may result in a difference between the parasitic capacitance of the pixel circuit D' in the odd row and the parasitic capacitance of the pixel circuit D' in the even row.

In view of this, embodiments of the present disclosure provide a display substrate including: a base substrate, a plurality of pixel circuits provided on the base substrate, a plurality of groups of data lines provided on the base substrate, and a plurality of first power lines provided on the base substrate. The plurality of pixel circuits are arranged in an array in a first direction and a second direction. The plurality of groups of data lines are arranged in the first direction, and at least one column of pixel circuits is electrically connected to at least one group of data lines. The plurality of first power lines are arranged in the first direction, and at least one column of pixel circuits is electrically connected to at least one first power line. The at least one column of pixel circuits includes a first pixel circuit and a second pixel circuit alternately arranged in the second direction. Each of the first pixel circuit and the second pixel circuit includes an input transistor, and the at least one group of data lines includes a first data line and a second data line. For at least one column of pixel circuits, the data lines electrically connected to the column of pixel circuits, and the first power line electrically connected to the column of pixel circuits, the input transistor of the first pixel circuit is electrically connected to the first data line, and the input transistor of the second pixel circuit is electrically connected to the second data line. An orthographic projection of the first data line on the base substrate, an orthographic projection of the first power line on the base substrate and an orthographic projection of the second data line on the base substrate are arranged in sequence in the first direction. An orthographic projection of the input transistor of the first pixel circuit on the base substrate is located on a side of the orthographic projection of the first power line on the base substrate close to the orthographic projection of the first data line on the base substrate, and an orthographic projection of the input transistor of the second pixel circuit on the base substrate is located on a side of the orthographic projection of the first power line on the base substrate close to the orthographic projection of the second data line on the base substrate.

In this way, each of the first pixel circuit and the second pixel circuit may be electrically connected to the data line without crossing the first power line, the parasitic capacitance of the first pixel circuit may be close to the parasitic capacitance of the second pixel circuit, and the horizontal stripes mura caused by the difference in parasitic capacitance may be improved.

The display substrate in embodiments of the present disclosure will be described in detail below with reference to FIG. 3 to FIG. 24.

Figure 3:
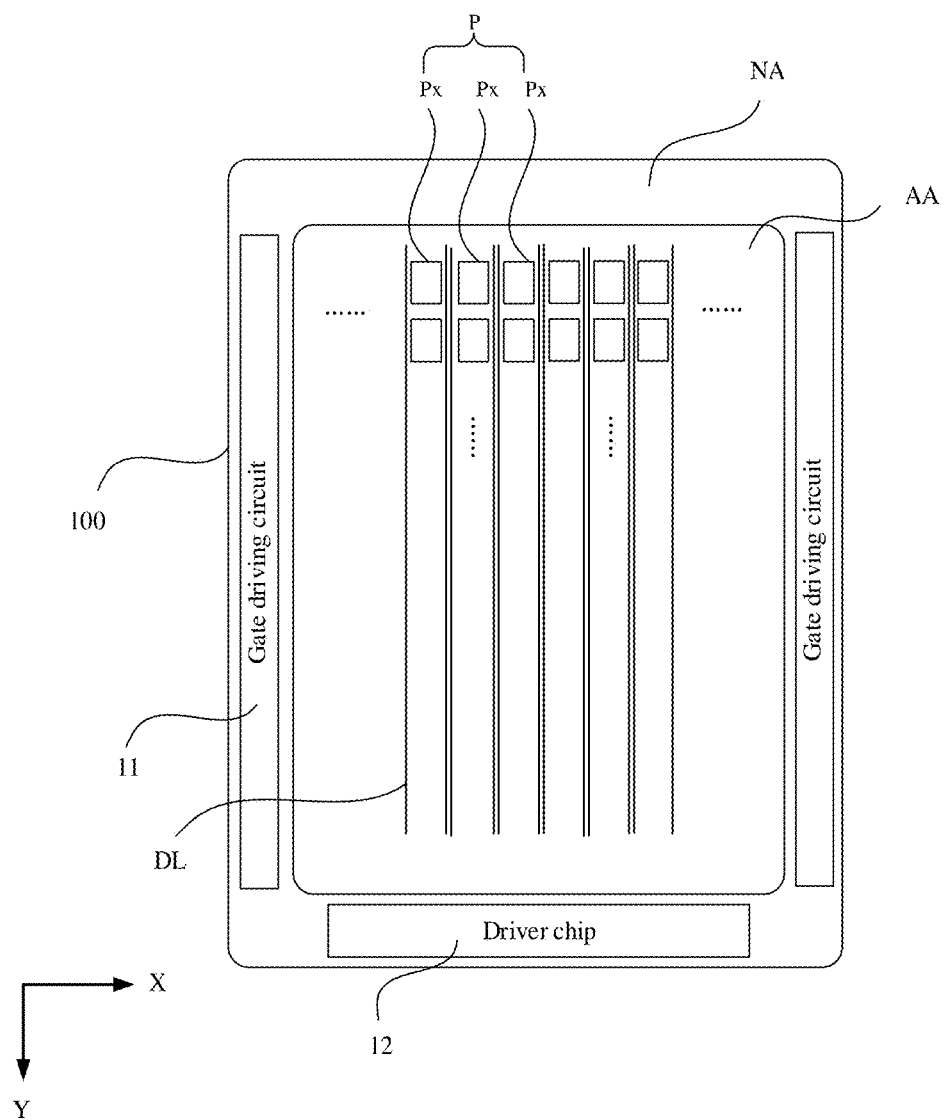
FIG. 3 schematically shows a schematic diagram of a display substrate in embodiments of the present disclosure.

FIG. 3 schematically shows a schematic diagram of a display substrate in embodiments of the present disclosure. Referring to FIG. 3, the display substrate in the embodiment includes a display region AA and a peripheral region NA at least partially surrounding the display region AA.

The display substrate may further include a gate driving circuit 11 and a driver chip 12 in the peripheral region NA. For example, the gate driving circuit 11 may be located on at least one side of the display region AA. In the embodiment shown in FIG. 3, the gate driving circuits 11 are located on a left side and a right side of the display region AA, respectively. It should be noted that the left side and the right side here may refer to a left side and a right side of the display substrate (screen) viewed by human eyes during display. For example, the driver chip 12 may be located on at least one side of the display region AA. In the embodiment shown in FIG. 3, the driver chip 12 is located on a lower side of the display region AA. It should be noted that the lower side here may be a lower side of the display substrate (screen) viewed by human eyes during display.

The gate driving circuit 11 may be implemented by a shift register, and the gate driving circuit 11 may provide scanning signals to gate lines (not shown) on the display substrate. The driver chip 12 may include a data driving circuit, which may provide data signals to various data lines DL on the display substrate.

It should be noted that FIG. 3 shows the gate driving circuits 11 being located on the left side and the right side of the display region AA, and the driver chip 12 being located on the lower side of the display region AA, however, embodiments of the present disclosure are not limited to this. The gate driving circuit 11 and the driver chip 12 may be located at any suitable positions in the peripheral region NA.

For example, the GOA technology, namely Gate Driver on Array, may be adopted for the gate driving circuit 11. In the GOA technology, the gate driving circuit 11 is provided directly on an array substrate to replace an external chip. Each GOA unit serves as a stage of shift register, and each stage of shift register is connected to a gate line. Scanning signals are sequentially output through various stages of shift registers to achieve progressive scanning of pixel units. In some embodiments, each stage of shift register may also be connected to a plurality of gate lines. In this way, it may adapt to a development trend of high resolution and narrow bezel of display substrates.

The display substrate may further include a base substrate 100 and a plurality of pixel units P provided on the base substrate 100 and in the display region AA. The plurality of pixel units P are arranged in an array in the first direction X and the second direction Y intersecting with the first direction X. For example, the first direction X is a horizontal direction in FIG. 3, and the second direction Y is a vertical direction in FIG. 3, that is, the first direction X and the second direction Y are perpendicular to each other.

At least one pixel unit P includes a plurality of sub-pixels Px. Optionally, a plurality of sub-pixels Px in a pixel unit P may have different colors. For example, a plurality of sub-pixels Px in a pixel unit P may include a red sub-pixel, a green sub-pixel, and a blue sub-pixel.

It should be noted that in FIG. 3, a shape of an orthographic projection of the sub-pixel on the base substrate is schematically shown as a rectangle, however, embodiments of the present disclosure are not limited to this. Moreover, an arrangement of three sub-pixels in a pixel unit P is not limited to that shown in FIG. 2.

The display substrate may further include a plurality of data lines DL provided on the base substrate 100 and in the display region AA. As shown in FIG. 3, at least one of the plurality of data lines DL may extend from an upper end of the display region AA to a lower end of the display region AA, so as to be electrically connected to the driver chip 12 located at the lower end of the display region AA.

In embodiments of the present disclosure, the display substrate may be a display substrate applied to a liquid crystal display panel, or the display substrate may also be a display substrate applied to an organic electroluminescent display panel, which is not limited in embodiments of the present disclosure.

For example, when the display substrate is a display substrate applied to an organic electroluminescent display panel, the sub-pixel may include a light emitting device and a pixel circuit used to drive the light emitting device to emit light.

Figure 4:
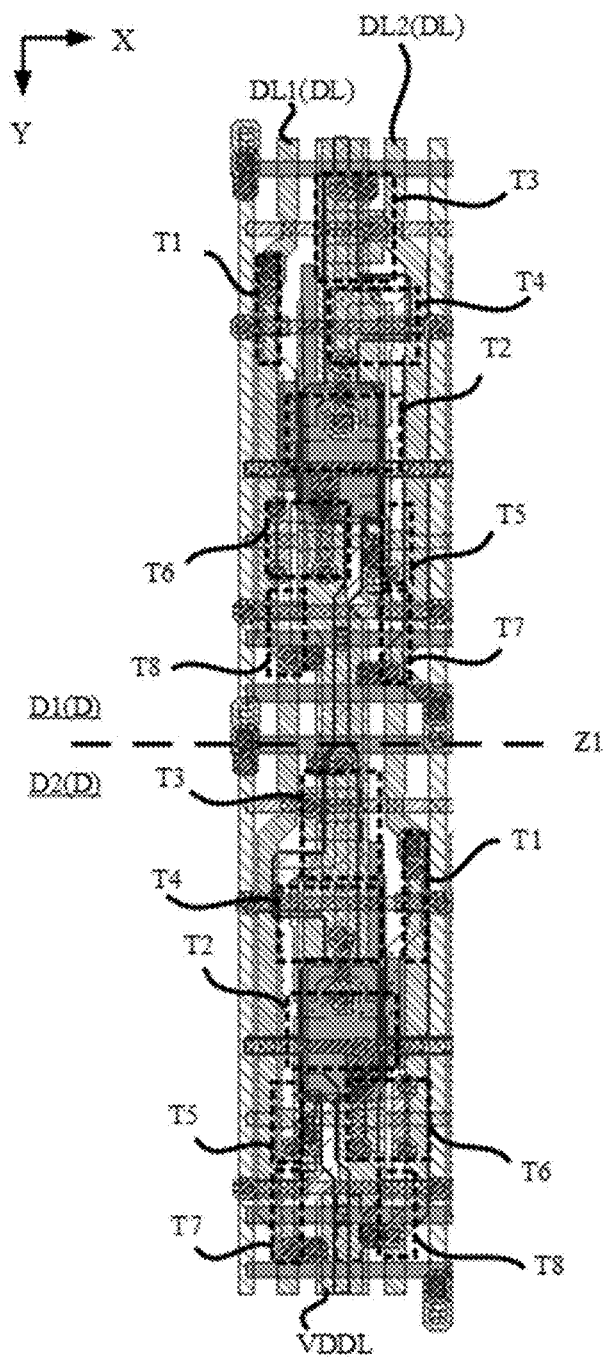
FIG. 4 schematically shows a schematic diagram of a column of pixel circuits in embodiments of the present disclosure.
Figure 5:
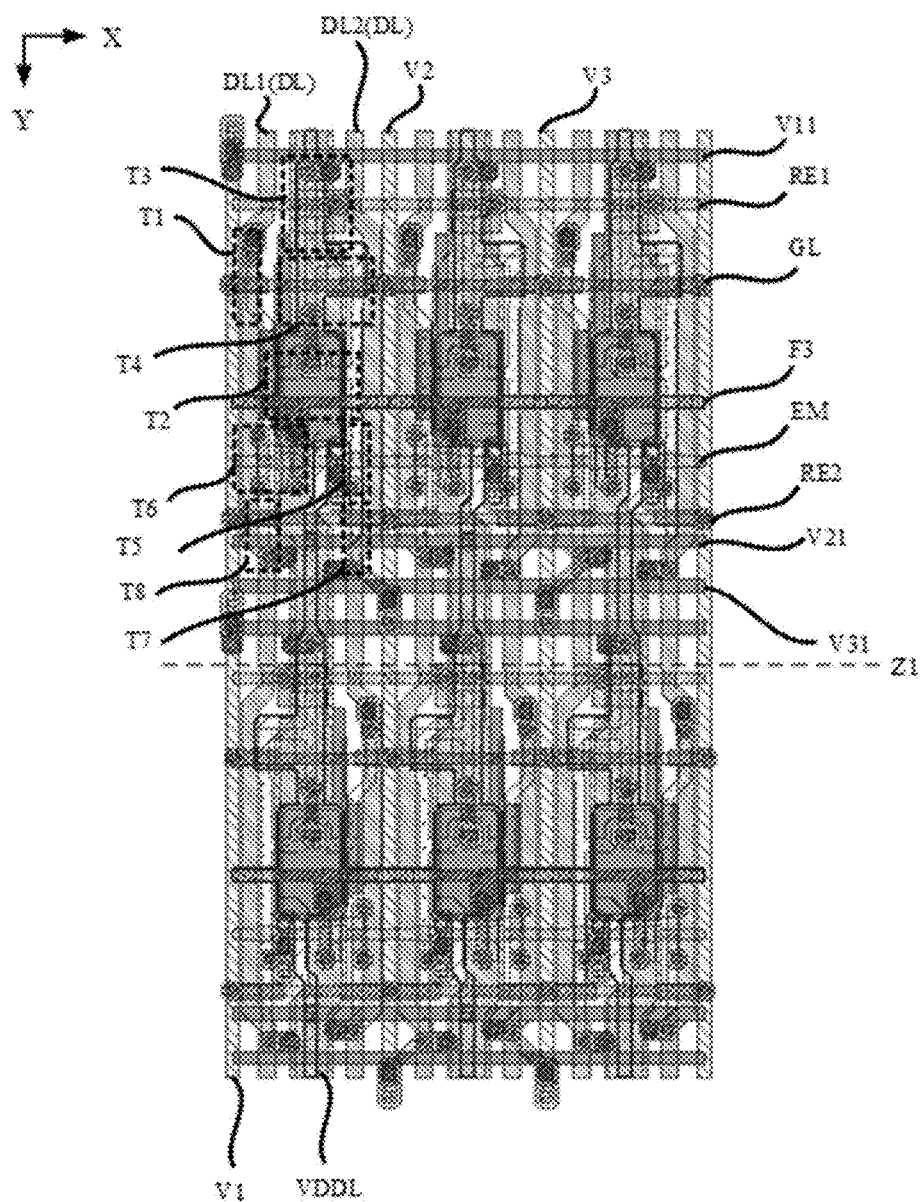
FIG. 5 schematically shows a schematic diagram of three columns of pixel circuits in embodiments of the present disclosure.

FIG. 4 schematically shows a schematic diagram of a column of pixel circuits in embodiments of the present disclosure, and FIG. 5 schematically shows a schematic diagram of three columns of pixel circuits in embodiments of the present disclosure. Referring to FIG. 4 and FIG. 5, a plurality of pixel circuits D are provided on a base substrate 100, and the plurality of pixel circuits D are arranged in an array in the first direction X and the second direction Y. A plurality of data lines DL are provided on the base substrate 100, the plurality of data lines DL may be divided into a plurality of groups, and the plurality of groups of data lines DL are arranged in the first direction X. For example, a group of data lines DL is electrically connected to a column of pixel circuits D, and different columns of pixel circuits D are electrically connected to different groups of data lines DL. For example, each group of data lines DL may include two data lines DL arranged in the first direction X, one of which is a first data line DL1, and the other one of which is a second data line DL2. Each column of pixel circuits D includes a first pixel circuit D1 and a second pixel circuit D2 alternately arranged in the second direction Y. For example, with a first reference line Z1 as a dividing line, a portion above the first reference line Z1 is the first pixel circuit D1, and a portion below the first reference line Z1 is the second pixel circuit D2. The first pixel circuit D1 may be the pixel circuit D in the odd row, and the second pixel circuit D2 may be the pixel circuit D in the even row: or the first pixel circuit D1 may be the pixel circuit D in the even row, and the second pixel circuit D2 may be the pixel circuit D in the odd row, which may be determined according to actual needs and is not limited in embodiments of the present disclosure. The first data line DL1 is electrically connected to the first pixel circuit D1, and the second data line DL2 is electrically connected to the second pixel circuit D2.

Referring to FIG. 4 and FIG. 5, a plurality of first power lines VDDL are further provided on the base substrate 100, and the plurality of first power lines VDDL are arranged in the first direction X. For example, a first power line VDDL is electrically connected to a column of pixel circuits D, and different columns of pixel circuits D are directly connected to different first power lines VDDL.

In some specific embodiments, the light emitting device may be an organic electroluminescent device, which may include an anode, an organic light emitting layer and a cathode that are arranged in a stack. The pixel circuit D may include a plurality of transistors. For example, the pixel circuit D may include an input transistor, a driving transistor, a threshold compensation transistor, a reset transistor, and a light emission control transistor.

For clarity, unless otherwise specified, a column of pixel circuits D is taken as an example for description. For a column of pixel circuits D, the data line DL electrically connected to the column of pixel circuits D, and the first power line VDDL electrically connected to the column of pixel circuits D, an input transistor T1 of the first pixel circuit D1 is electrically connected to the first data line DL1, and an input transistor T1 of the second pixel circuit D2 is electrically connected to the second data line DL2. In other words, a technical solution of dual data lines DL (dual source) is adopted for the display substrate in embodiments of the present disclosure so as to solve the problem of insufficient compensation time during high frequency display.

An orthographic projection of the first data line DL1 on the base substrate 100, an orthographic projection of the first power line VDDL on the base substrate 100 and an orthographic projection of the second data line DL2 on the base substrate 100 are arranged in sequence in the first direction X. For example, referring to FIG. 4, the first data line DL1 is located on a left side of the first power line VDDL, and the second data line DL2 is located on a right side of the first power line VDDL. Optionally, the first data line DL1, the first power line VDDL and the second data line DL2 may be arranged in a same layer and made of a same material.

An orthographic projection of the input transistor T1 of the first pixel circuit D1 on the base substrate 100 is located on a side of the orthographic projection of the first power line VDDL on the base substrate 100 close to the orthographic projection of the first data line DL1 on the base substrate 100, and an orthographic projection of the input transistor T1 of the second pixel circuit D2 on the base substrate 100 is located on a side of the orthographic projection of the first power line VDDL on the base substrate 100 close to the orthographic projection of the second data line DL2 on the base substrate 100.

For example, referring to FIG. 4, the input transistor T1 of the first pixel circuit D1 is located on the left side of the first power line VDDL and electrically connected to the first data line DL1 on the left side, while the input transistor T1 of the second pixel circuit D2 is located on the right side of the first power line VDDL and electrically connected to the second data line DL2 on the right side. Compared to the solution shown in FIG. 1 and FIG. 2, in embodiments of the present disclosure, the first pixel circuit D1 and the second pixel circuit D2 may be electrically connected to the data lines DL without crossing the first power line VDDL, so that the parasitic capacitance of the first pixel circuit D1 is close to the parasitic capacitance of the second pixel circuit D2, and the horizontal stripes mura caused by the difference in parasitic capacitance may be improved.

The display substrate in embodiments of the present disclosure will be further described below with reference to FIG. 3 to FIG. 24.

Figure 8:
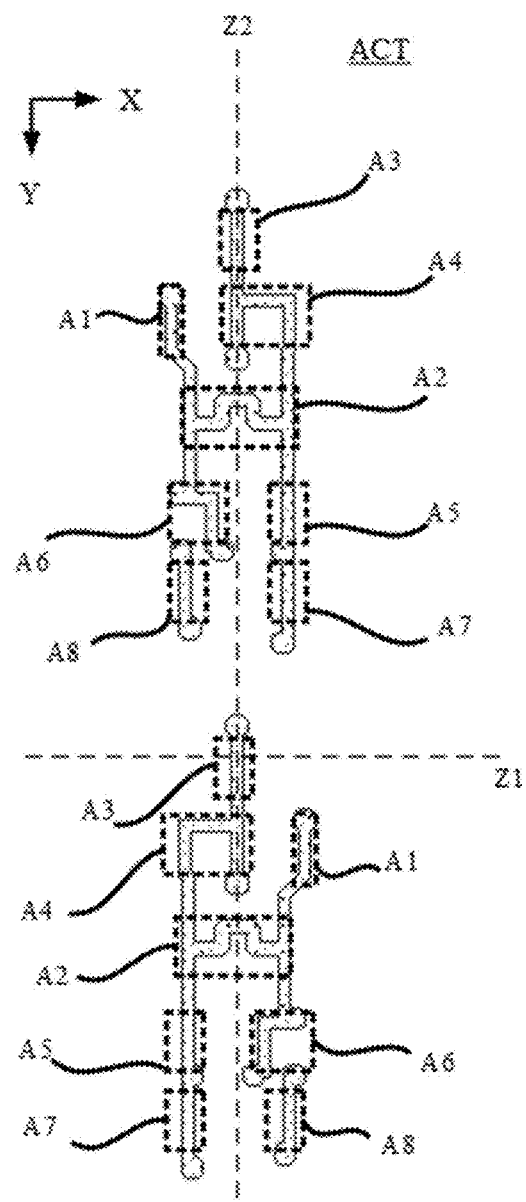
FIG. 8 to FIG. 24 schematically show schematic diagrams of various film layers in a display substrate in embodiments of the present disclosure, where FIG. 8 schematically shows a schematic plan view of a semiconductor layer in embodiments of the present disclosure, FIG. 9 schematically shows a schematic plan view of a first gate metal layer in embodiments of the present disclosure, FIG. 10 schematically shows a schematic plan view of a first conductive layer in embodiments of the present disclosure, FIG. 11 schematically shows a schematic plan view of a second conductive layer in embodiments of the present disclosure, FIG. 12 schematically shows a schematic plan view of a third conductive layer in embodiments of the present disclosure, FIG. 13 schematically shows a schematic plan view of an interlayer insulation layer in embodiments of the present disclosure, FIG. 14 schematically shows a schematic plan view of a first shielding layer, a semiconductor layer, a first gate metal layer, a second gate metal layer, an interlayer insulation layer and a first conductive layer in embodiments of the present disclosure, FIG. 15 schematically shows a schematic plan view of a second gate metal layer in embodiments of the present disclosure, FIG. 16 schematically shows a schematic plan view of a first insulation layer in embodiments of the present disclosure, FIG. 17 schematically shows a schematic plan view of a first conductive layer, a first insulation layer and a second conductive layer in embodiments of the present disclosure, FIG. 18 schematically shows a schematic plan view of a second insulation layer in embodiments of the present disclosure, FIG. 19 schematically shows a schematic plan view of a second conductive layer, a second insulation layer and a third conductive layer in embodiments of the present disclosure, FIG. 20 schematically shows a schematic plan view of a first shielding layer in embodiments of the present disclosure, FIG. 21 schematically shows a schematic plan view of a first electrode layer in embodiments of the present disclosure, FIG. 22 schematically shows a schematic plan view of a pixel definition layer in embodiments of the present disclosure, FIG. 23 schematically shows a schematic plan view of a third insulation layer in embodiments of the present disclosure, and FIG. 24 schematically shows a schematic plan view of a third conductive layer, a third insulation layer, a first electrode layer and a pixel definition layer in embodiments of the present disclosure.
Figure 9:
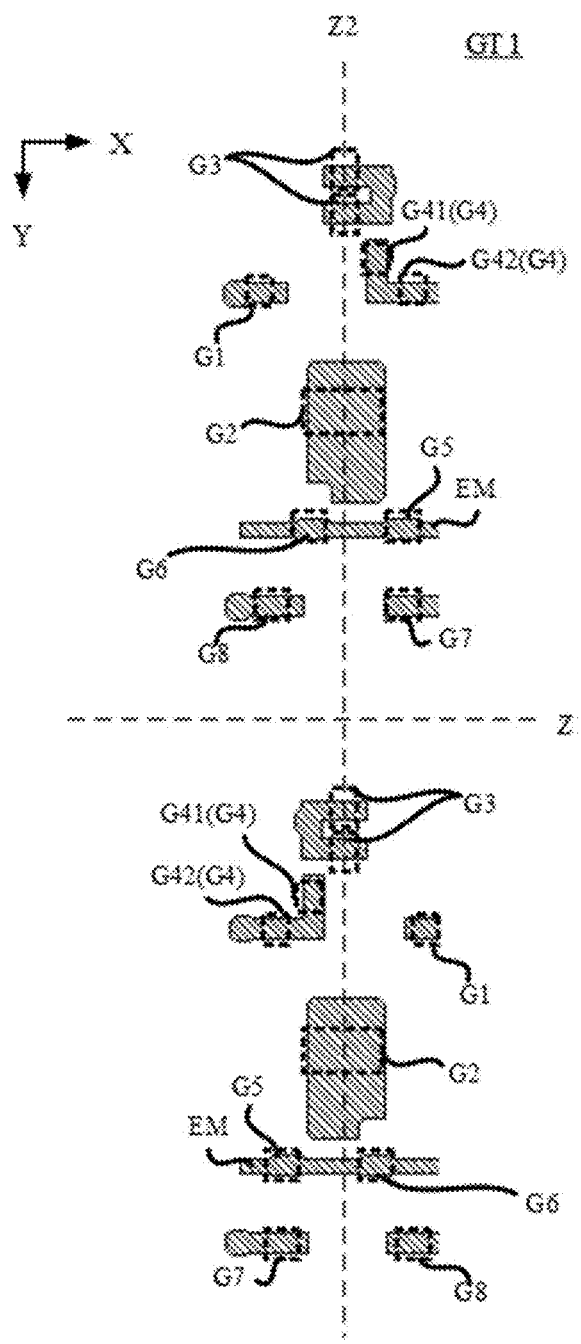
Figure 10:
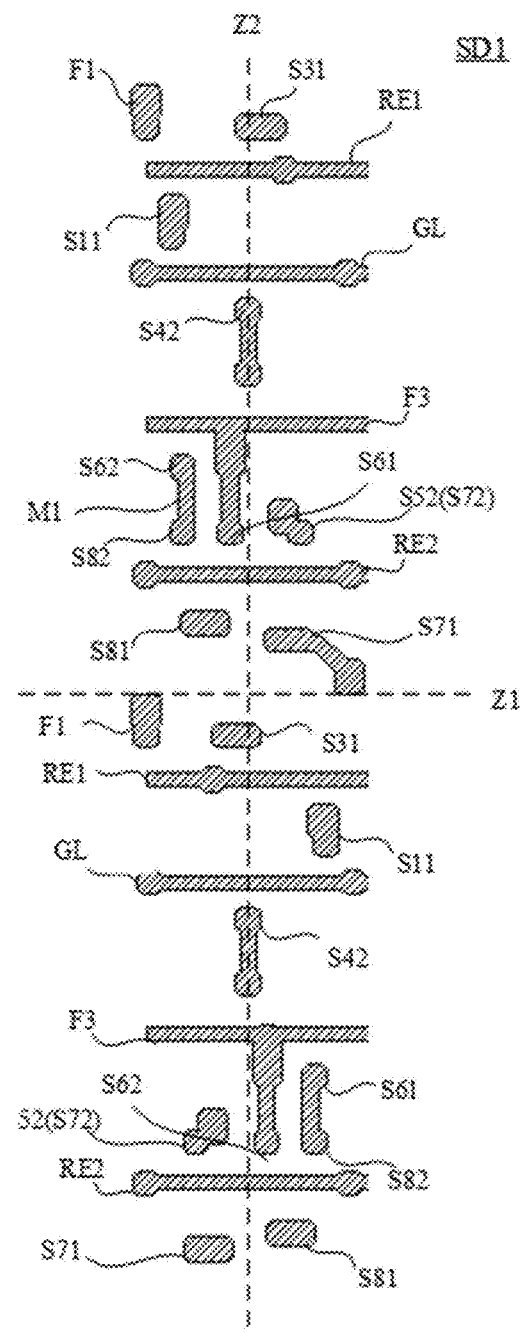
Figure 11:
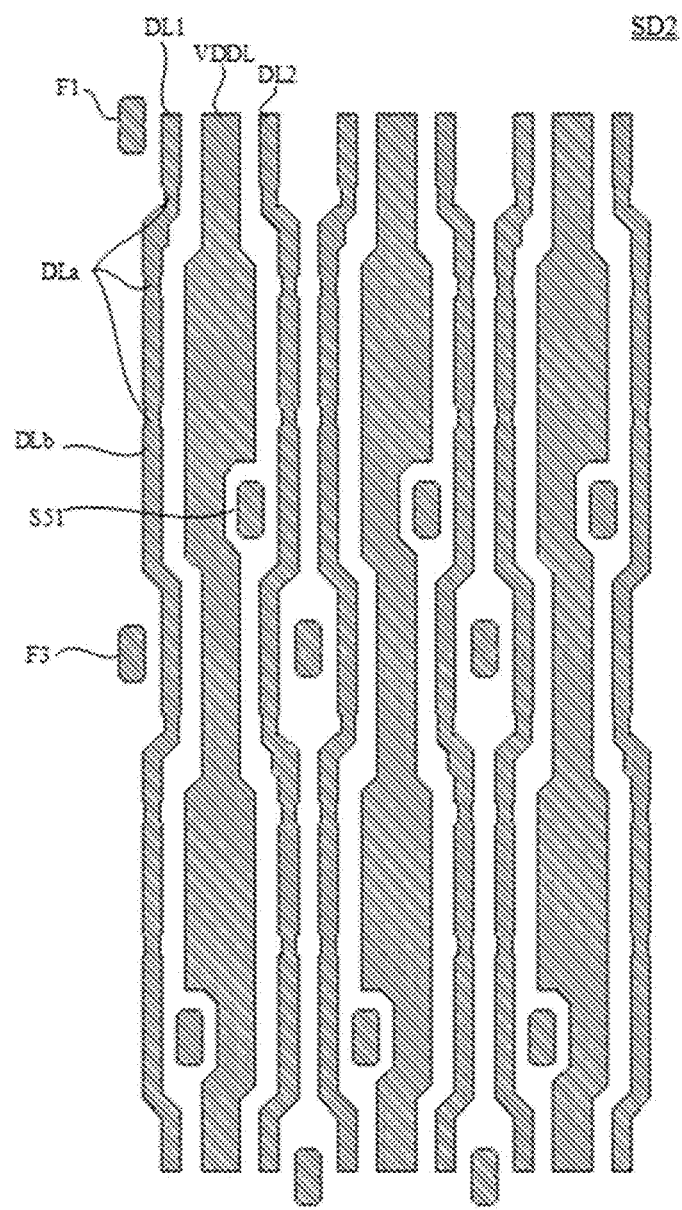
Figure 12:
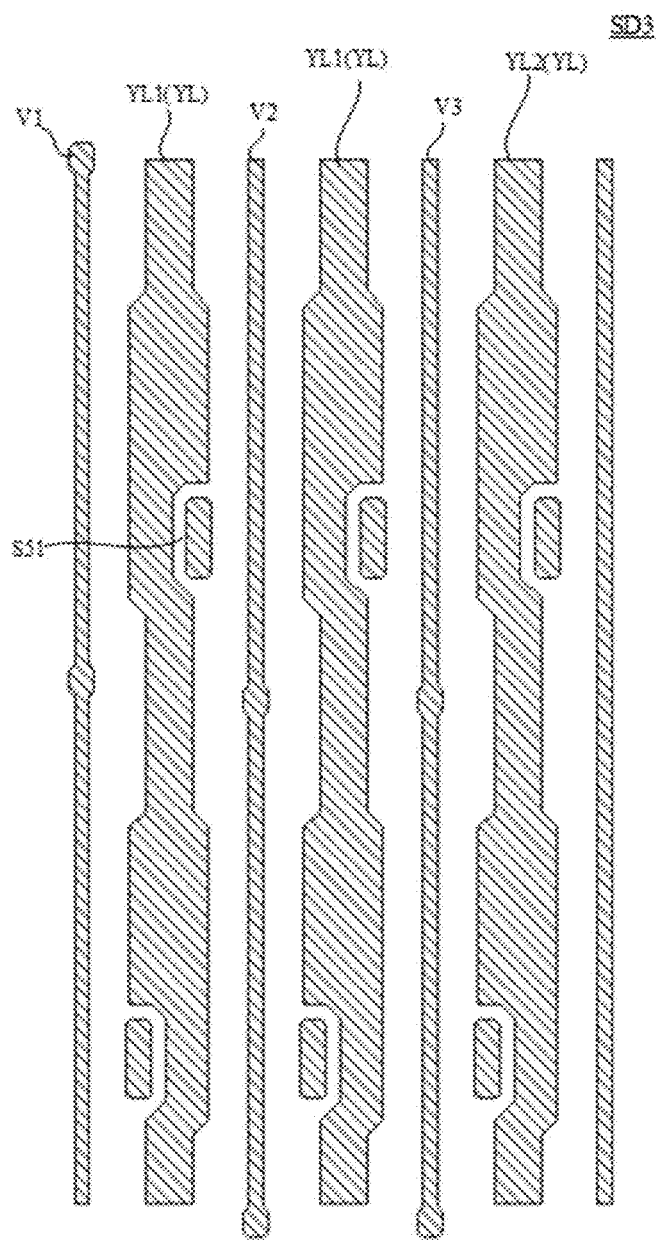
Figure 13:
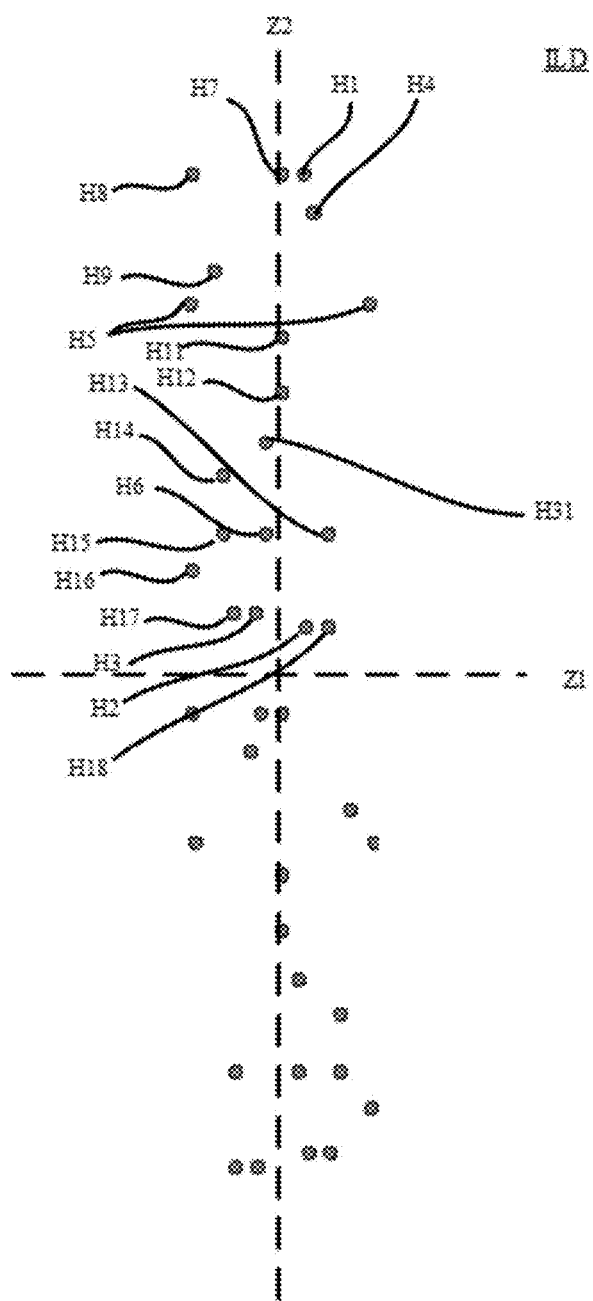
Figure 14:
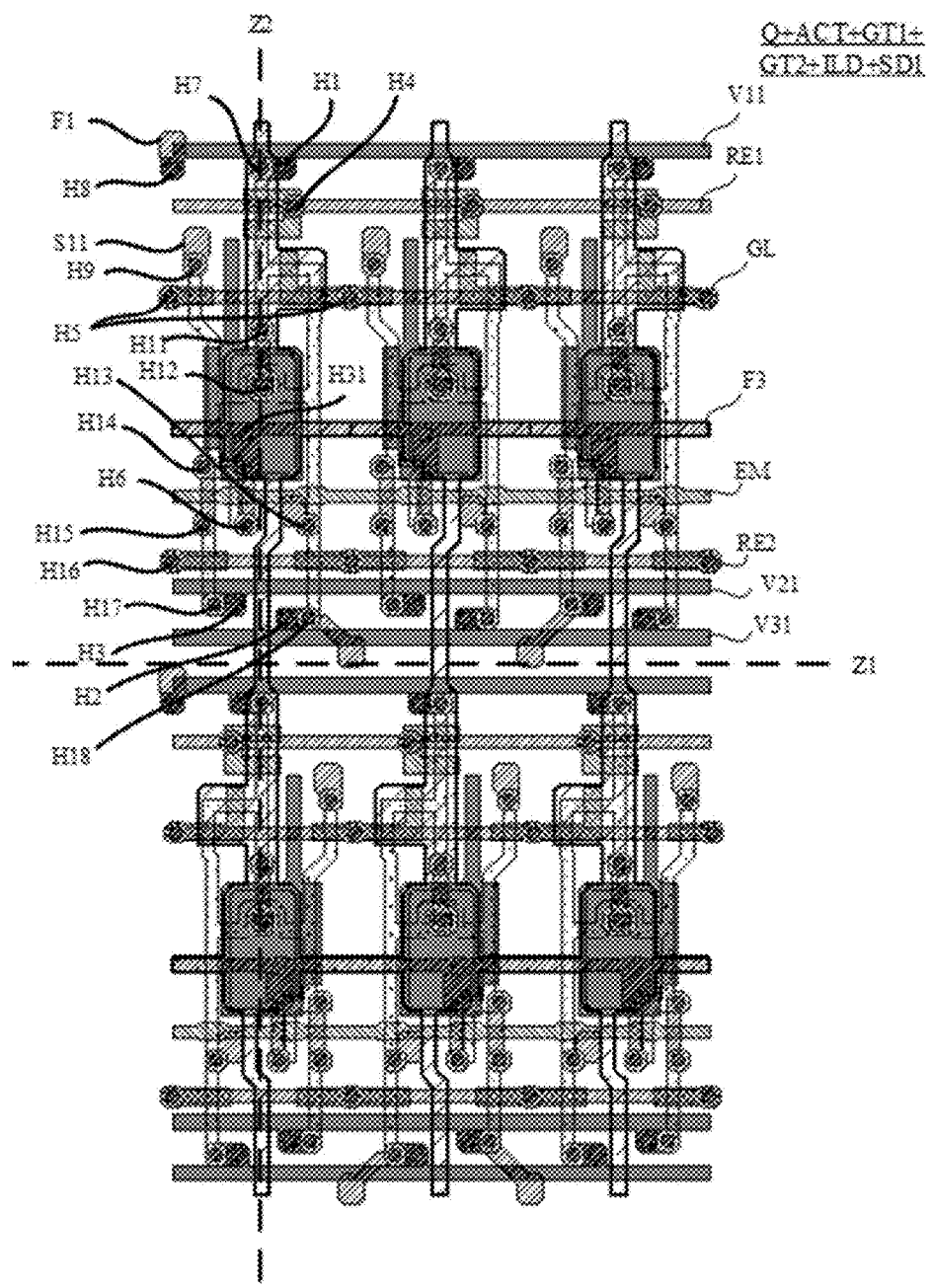
Figure 15:
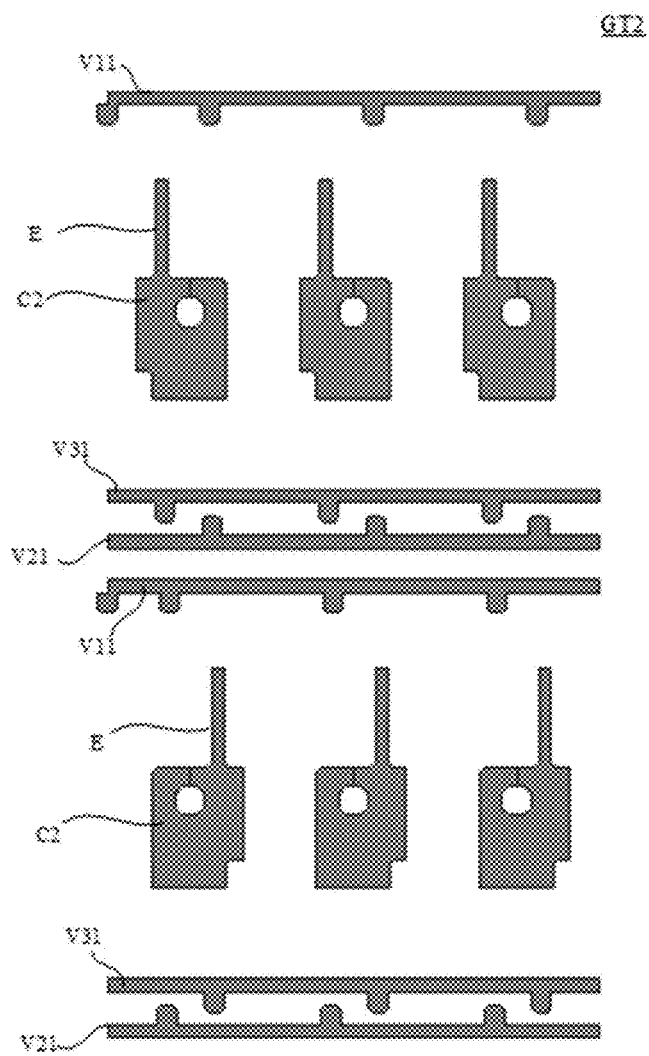
Figure 16:
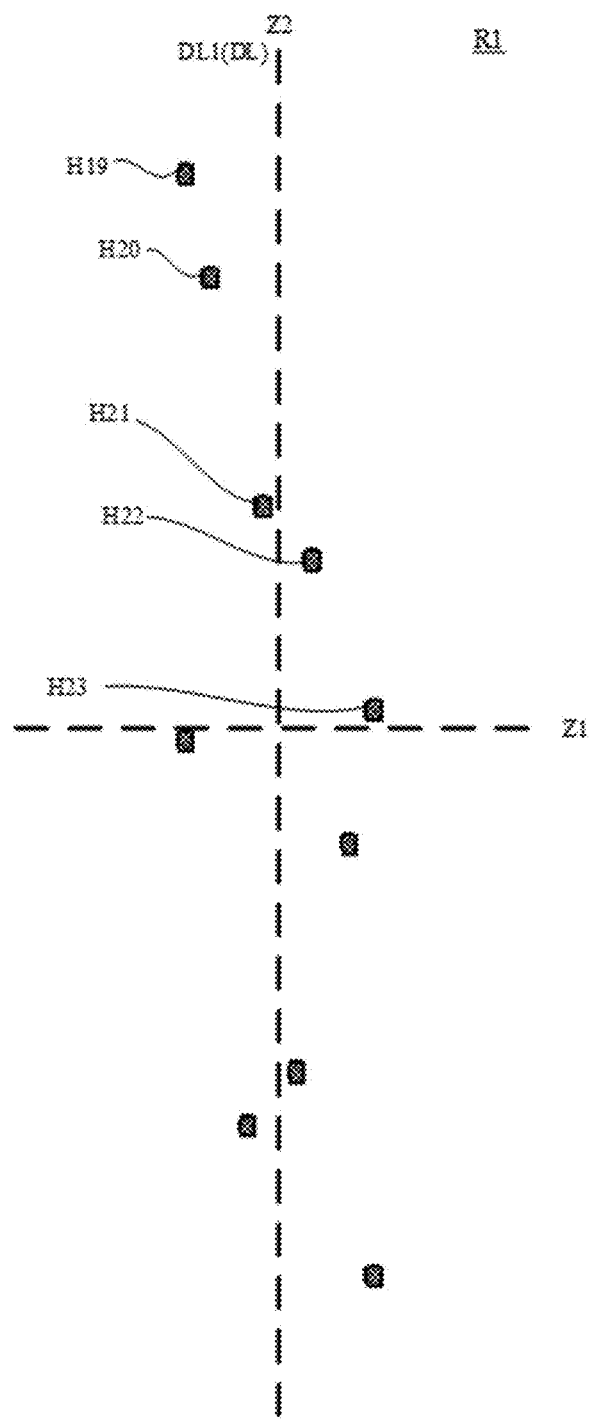
Figure 17:
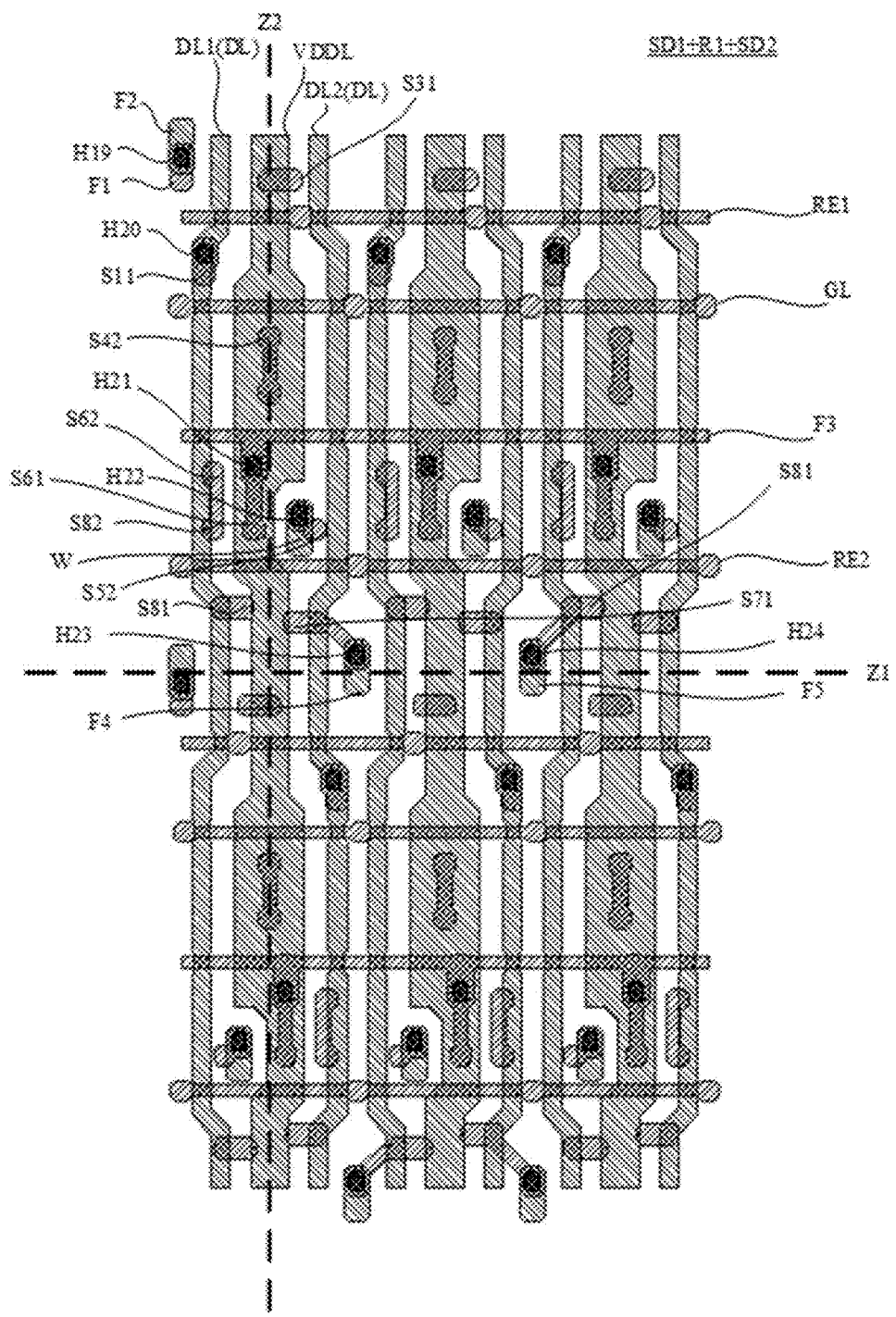
Figure 18:
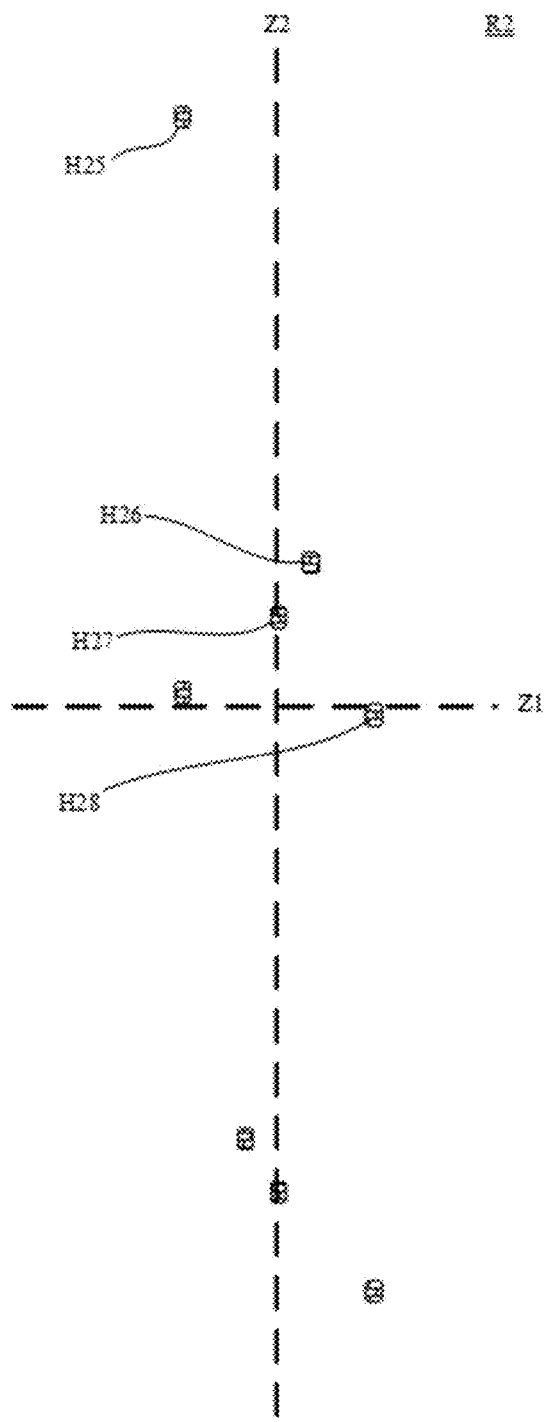
Figure 19:
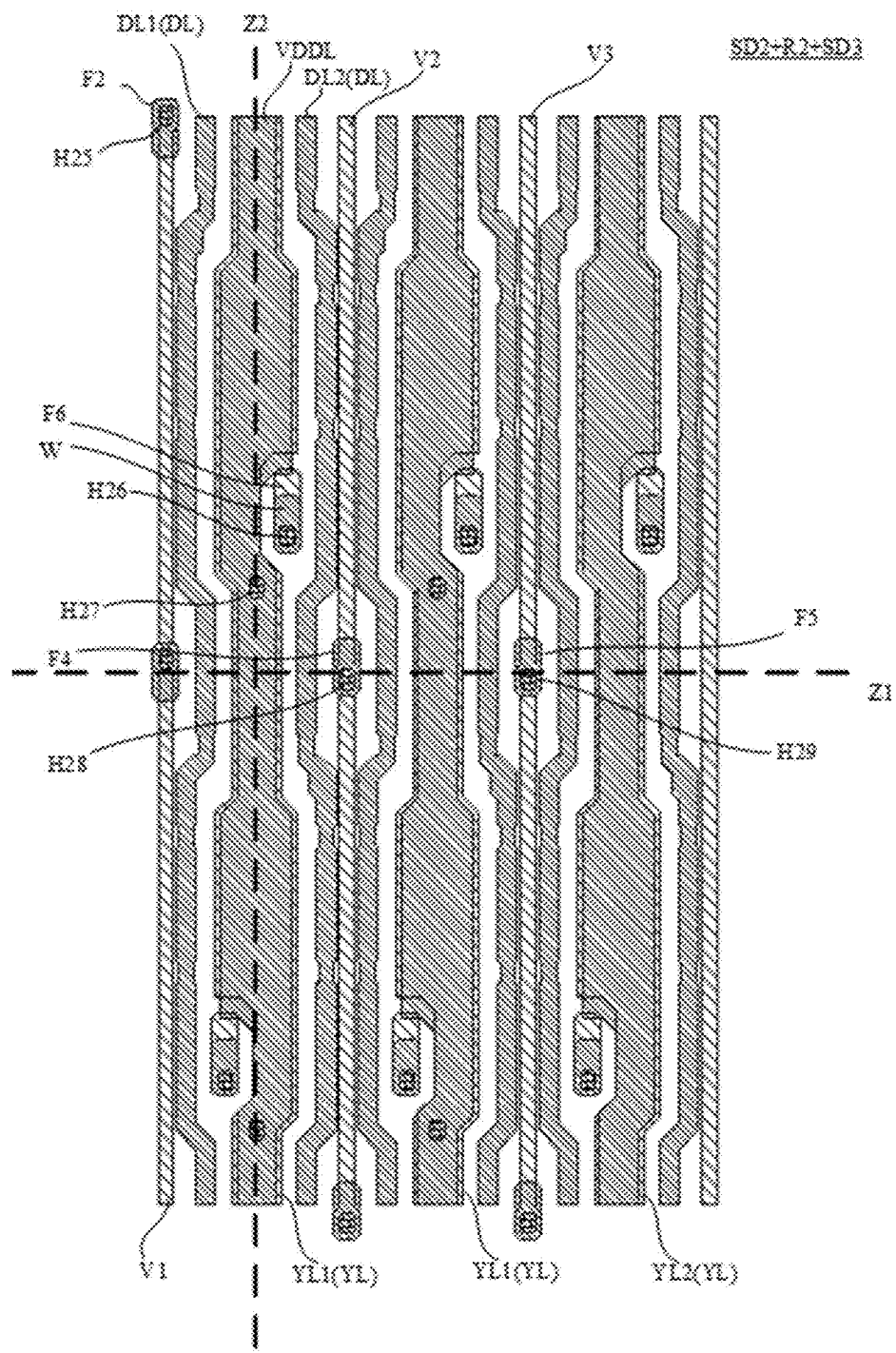
Figure 20:
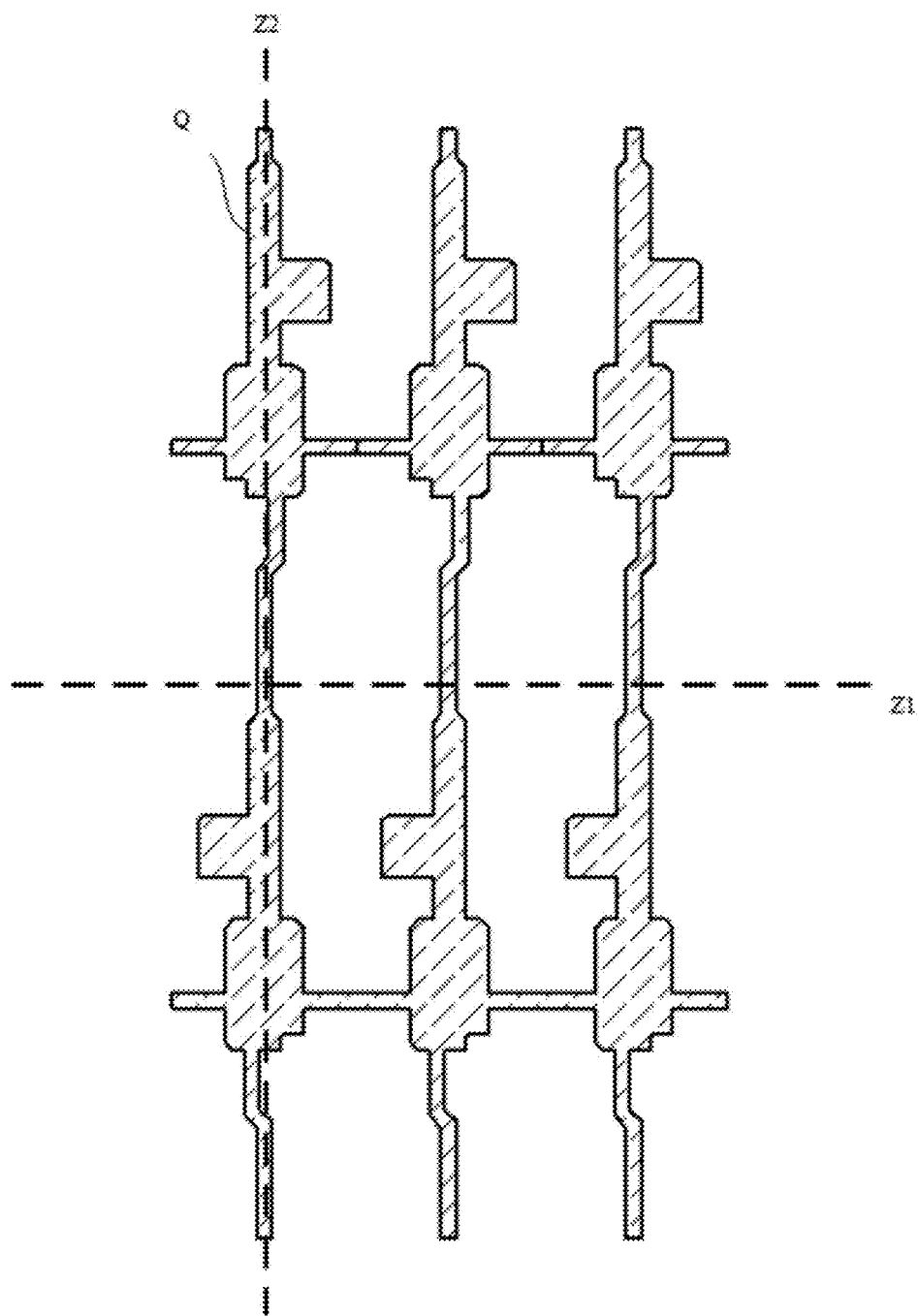
Figure 21:
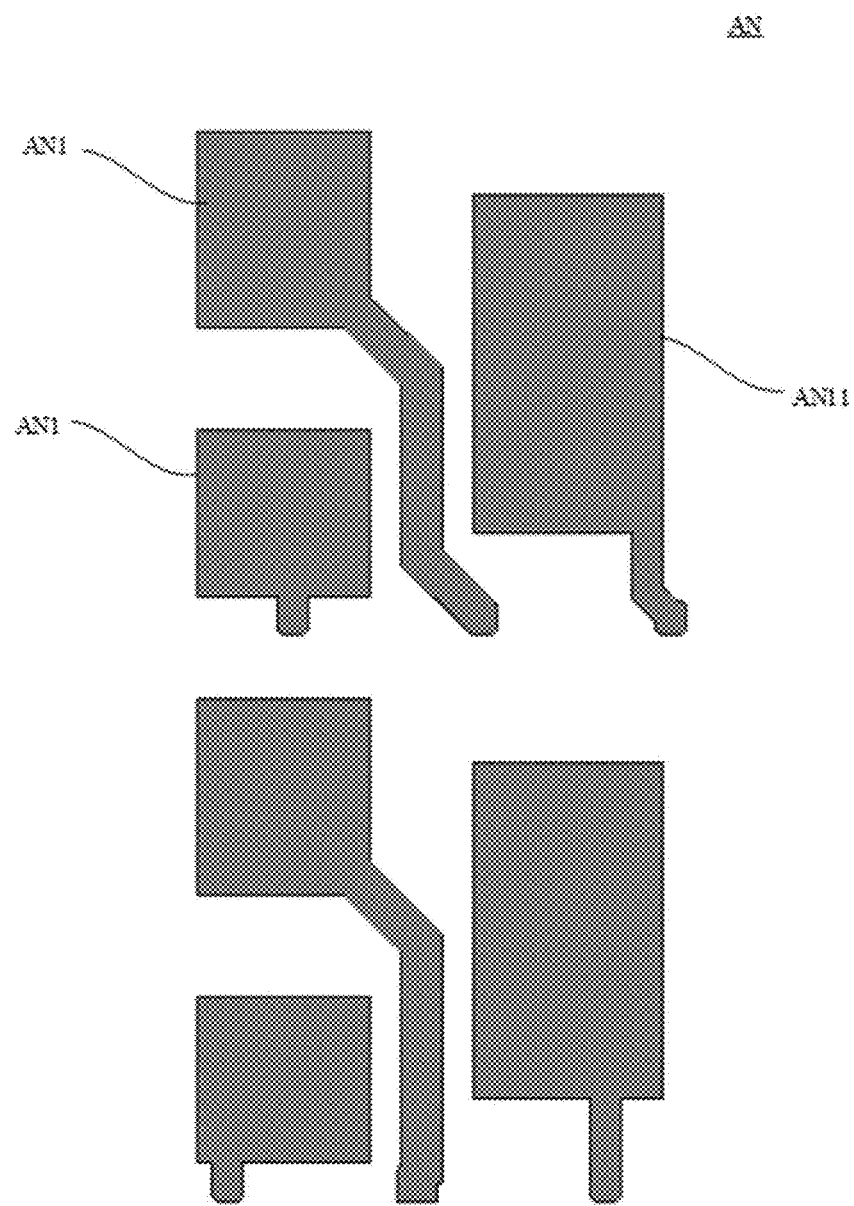
Figure 22:
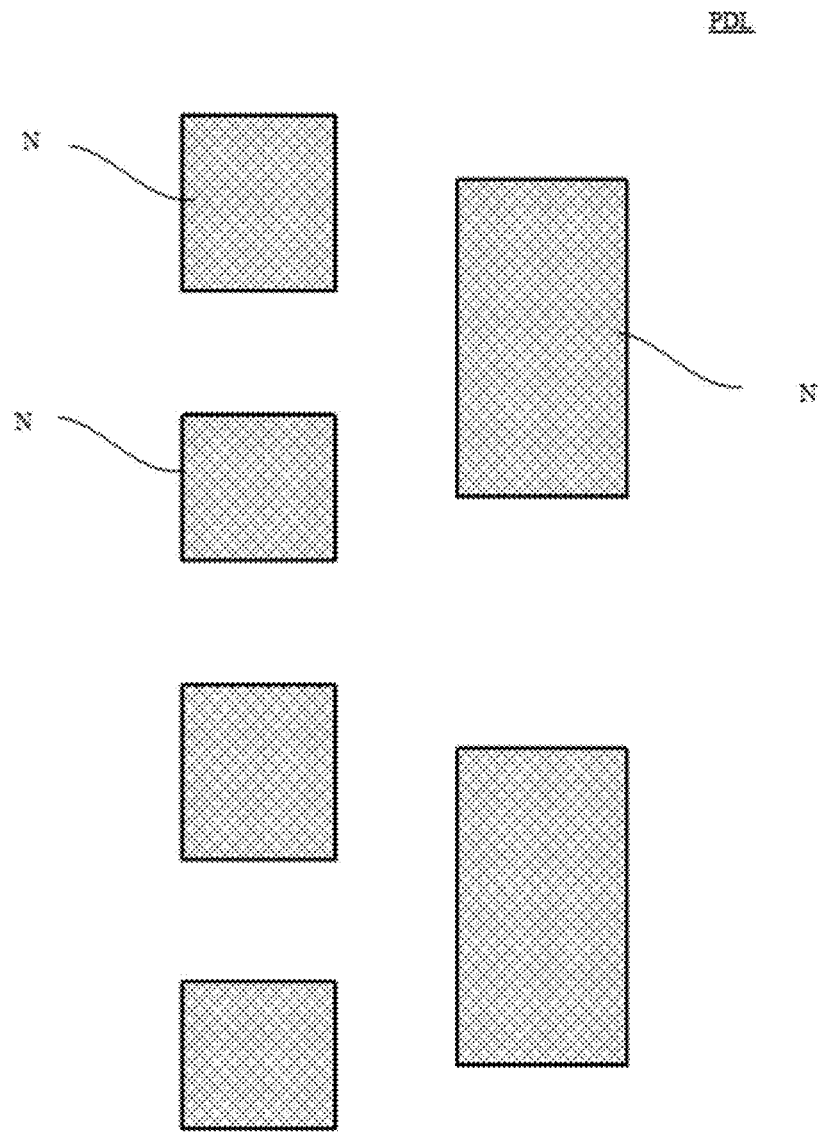
Figure 23:
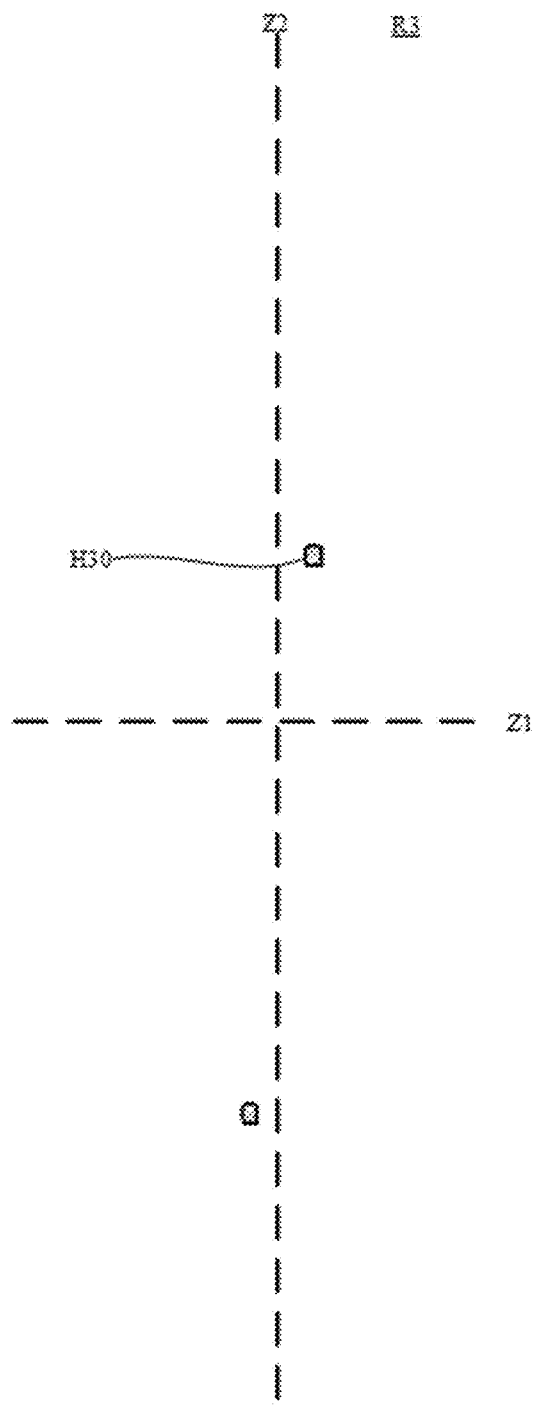
Figure 24:
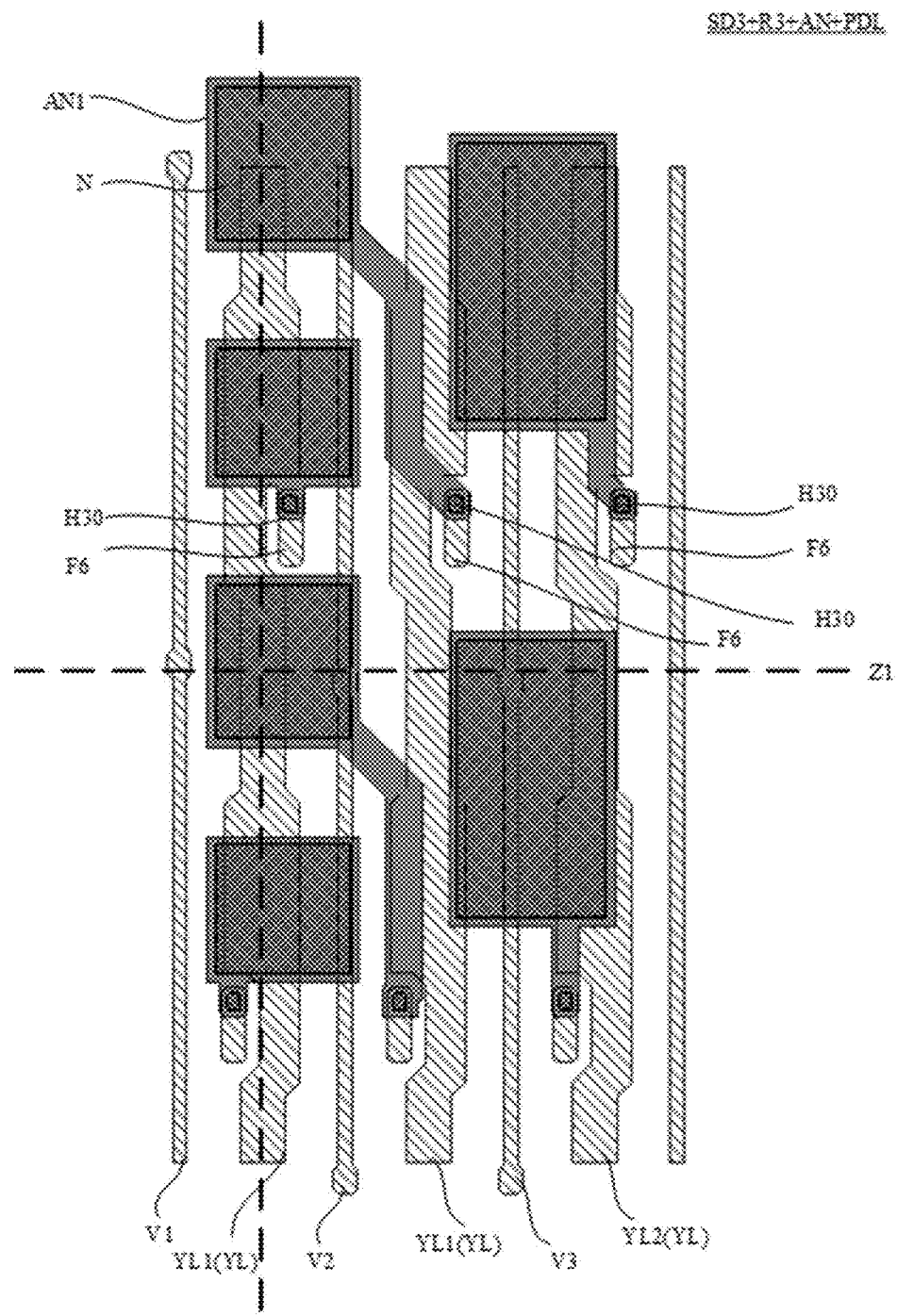

FIG. 8 to FIG. 24 schematically show schematic diagrams of various film layers in the display substrate in embodiments of the present disclosure, where FIG. 8 schematically shows a schematic plan view of a semiconductor layer in embodiments of the present disclosure, FIG. 9 schematically shows a schematic plan view of a first gate metal layer in embodiments of the present disclosure, FIG. 10 schematically shows a schematic plan view of a first conductive layer in embodiments of the present disclosure, FIG. 11 schematically shows a schematic plan view of a second conductive layer in embodiments of the present disclosure, FIG. 12 schematically shows a schematic plan view of a third conductive layer in embodiments of the present disclosure, FIG. 13 schematically shows a schematic plan view of an interlayer insulation layer in embodiments of the present disclosure, FIG. 14 schematically shows a schematic plan view of a first shielding layer, a semiconductor layer, a first gate metal layer, a second gate metal layer, an interlayer insulation layer and a first conductive layer in embodiments of the present disclosure, FIG. 15 schematically shows a schematic plan view of a second gate metal layer in embodiments of the present disclosure, FIG. 16 schematically shows a schematic plan view of a first insulation layer in embodiments of the present disclosure, FIG. 17 schematically shows a schematic plan view of a first conductive layer, a first insulation layer and a second conductive layer in embodiments of the present disclosure, FIG. 18 schematically shows a schematic plan view of a second insulation layer in embodiments of the present disclosure, FIG. 19 schematically shows a schematic plan view of a second conductive layer, a second insulation layer and a third conductive layer in embodiments of the present disclosure, FIG. 20 schematically shows a schematic plan view of a first shielding layer in embodiments of the present disclosure, FIG. 21 schematically shows a schematic plan view of a first electrode layer in embodiments of the present disclosure, FIG. 22 schematically shows a schematic plan view of a pixel definition layer in embodiments of the present disclosure, FIG. 23 schematically shows a schematic plan view of a third insulation layer in embodiments of the present disclosure, and FIG. 24 schematically shows a schematic plan view of a third conductive layer, a third insulation layer, a first electrode layer and a pixel definition layer in embodiments of the present disclosure.

Referring to FIG. 8 to FIG. 24, in some specific embodiments, the display substrate includes a semiconductor layer ACT provided on the base substrate 100, a first gate metal layer GT1 provided on a side of the semiconductor layer ACT away from the base substrate 100, a first conductive layer SD1 provided on a side of the first gate metal layer GT1 away from the base substrate 100, a second conductive layer SD2 provided on a side of the first conductive layer SD1 away from the base substrate 100, and a third conductive layer SD3 provided on a side of the second conductive layer SD2 away from the base substrate 100.

Figure 6:
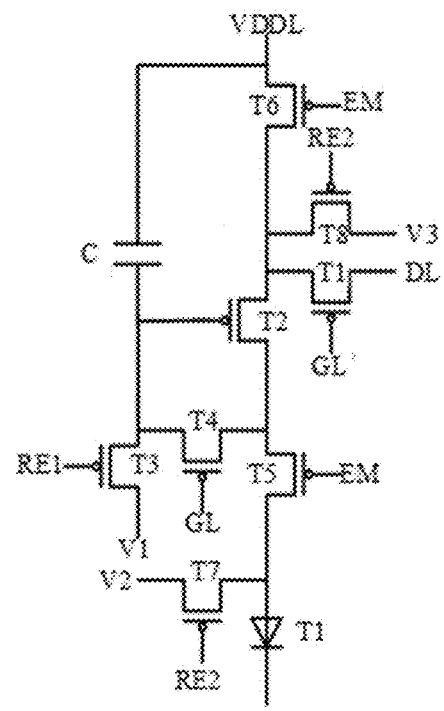
FIG. 6 schematically shows an equivalent circuit diagram of a pixel circuit in embodiments of the present disclosure.

FIG. 6 schematically shows an equivalent circuit diagram of the pixel circuit in embodiments of the present disclosure. Referring to FIG. 4 to FIG. 6, the pixel circuit D in embodiments of the present disclosure may adopt an 8T1C structure. It should be noted that the 8T1C structure is illustrated here by way of example in describing the pixel circuit D in embodiments of the present disclosure, however, the pixel circuit in embodiments of the present disclosure is not limited to the 8T1C structure.

In some specific embodiments, the display substrate further includes at least one first scanning signal line GL located in the first conductive layer SD1, and the at least one pixel circuit D further includes a driving transistor T2 and a storage capacitor CT. In the at least one pixel circuit D, a first electrode of the input transistor T1 is electrically connected to the data line DL, a gate electrode of the input transistor T1 is electrically connected to the at least one first scanning signal line GL, a first electrode of the driving transistor T2 is electrically connected to a second electrode of the input transistor T1, a second electrode of the driving transistor T2 is electrically connected to a first electrode of a light emitting device L, a gate electrode of the driving transistor T2 is electrically connected to a first electrode plate of the storage capacitor CT through a first connecting hole (also referred to as a twelfth via hole H12), and a second electrode plate of the storage capacitor CT is electrically connected to the first power line VDDL.

In embodiments of the present disclosure, for a column of pixel circuits D, transistors in the first pixel circuit D1 may be designed to be mirror symmetrical with transistors in the second pixel circuit D2 about a first axis (i.e., a second reference line Z2), so that the parasitic capacitance on the transistors (or even connecting lines of the transistors) in the first pixel circuit D1 may be approximately the same as the parasitic capacitance on the transistors in the second pixel circuit D2, which is beneficial for maintaining consistency between the parasitic capacitance of the first pixel circuit D1 and the parasitic capacitance of the second pixel circuit D2, a specific implementation of which is as follows.

For at least one column of pixel circuits D, the input transistor T1 of the first pixel circuit D1 after being translated in the second direction Y may be mirror symmetrical with the input transistor T1 of the second pixel circuit D2 about the first axis. The first axis extends in the second direction Y, and the first connecting hole (the twelfth via hole H12) is located on the first axis.

In embodiments of the present disclosure, to be mirror symmetrical about the first axis specifically means that two transistors are at a same distance from the first axis, and a pattern of one of the two transistors after being folded along the first axis may overlap with a pattern of the other. Mirror symmetry mentioned below has the same meaning as here, which will not be repeated hereinafter.

In this way, the parasitic capacitance on a path along the data line DL, the input transistor T1 and the driving transistor T2 in the first pixel circuit D1 may be approximately the same as the parasitic capacitance on a path along the data line DL, the input transistor T1 and the driving transistor T2 in the second pixel circuit D2, which is beneficial for maintaining consistency between the parasitic capacitance of the first pixel circuit D1 and the parasitic capacitance of the second pixel circuit D2.

In some specific embodiments, for the at least one column of pixel circuits D, the data lines DL electrically connected to the column of pixel circuits D, and the first power line VDDL electrically connected to the column of pixel circuits D, the input transistor T1 of the first pixel circuit D1 is electrically connected to the first data line DL1, and the input transistor T1 of the second pixel circuit D2 is electrically connected to the second data line DL2. In the first direction X, an orthographic projection of the input transistor T1 of the first pixel circuit D1 on the base substrate 100 is located on a side of an orthographic projection of the driving transistor T2 of the first pixel circuit D1 on the base substrate 100 close to the orthographic projection of the first data line DL1 on the base substrate 100, and an orthographic projection of the input transistor T1 of the second pixel circuit D2 on the base substrate 100 is located on a side of an orthographic projection of the driving transistor T2 of the second pixel circuit D2 on the base substrate 100 close to the orthographic projection of the second data line DL2 on the base substrate 100. For example, for the first pixel circuit D1, the input transistor T1 is located on the left side of the driving transistor T2; and for the second pixel circuit D2, the input transistor T1 is located on the right side of the driving transistor T2.

In some specific embodiments, the display substrate further includes at least one first reset signal line V1 located in the third conductive layer SD3 and at least one second scanning signal line RE1 located in the first conductive layer SD1, and the at least one pixel circuit D further includes a first reset transistor T3. In the at least one pixel circuit D, the first reset transistor T3 has a first electrode electrically connected to the at least one first reset signal line V1, a second electrode electrically connected to the gate electrode of the driving transistor T2, and a gate electrode electrically connected to the at least one second scanning signal line RE1.

For the at least one column of pixel circuits D, the first reset transistor T3 of the first pixel circuit D1 after being translated in the second direction Y may be mirror symmetrical with the first reset transistor T3 of the second pixel circuit D2 about the first axis.

In this way, the parasitic capacitance on a path along the first reset signal line V1, the first reset transistor T3 and the driving transistor T2 in the first pixel circuit D1 is approximately the same as the parasitic capacitance on a path along the first reset signal line V1, the first reset transistor T3 and the driving transistor T2 in the second pixel circuit D2, which is beneficial for maintaining consistency between the parasitic capacitance of the first pixel circuit D1 and the parasitic capacitance of the second pixel circuit D2.

In some specific embodiments, in the at least one pixel circuit D, the first electrode of the first reset transistor T3 and the gate electrode of the first reset transistor are both located on the first axis.

Optionally, in a column of pixel circuits, the first electrode of the first reset transistor T3 and the gate electrode of the first reset transistor in each pixel circuit D are located on one and same first axis.

In some specific embodiments, the at least one pixel circuit D further includes a threshold compensation transistor T4. In the at least one pixel circuit D, the threshold compensation transistor T4 has a first electrode electrically connected to the second electrode of the driving transistor T2, a second electrode electrically connected to the gate electrode of the driving transistor T2, and a gate electrode electrically connected to the first scanning signal line GL.

For the at least one column of pixel circuits D, the threshold compensation transistor T4 of the first pixel circuit D1 after being translated in the second direction Y may be mirror symmetrical with the threshold compensation transistor T4 of the second pixel circuit D2 about the first axis. In this way, the parasitic capacitance on a path along the second electrode of the driving transistor T2, the threshold compensation transistor T4 and the gate electrode of the driving transistor T2 in the first pixel circuit D1 is approximately the same as the parasitic capacitance on a path along the second electrode of the driving transistor T2, the threshold compensation transistor T4 and the gate electrode of the driving transistor T2 in the second pixel circuit D2, which is beneficial for maintaining consistency between the parasitic capacitance of the first pixel circuit D1 and the parasitic capacitance of the second pixel circuit D2.

In some specific embodiments, the display substrate further includes a plurality of light emission control signal lines EM provided in the first gate metal layer GT1, and the at least one pixel circuit D further includes a first light emission control transistor T5. In the at least one pixel circuit D, the first light emission control transistor T5 has a first electrode electrically connected to the second electrode of the driving transistor T2, a second electrode electrically connected to the first electrode of the light emitting device L, and a gate electrode electrically connected to at least one light emission control signal line EM.

For the at least one column of pixel circuits D, the first light emission control transistor T5 of the first pixel circuit D1 after being translated in the second direction Y may be mirror symmetrical with the first light emission control transistor T5 of the second pixel circuit D2 about the first axis. In this way, the parasitic capacitance on a path along the second electrode of the driving transistor T2, the first light emission control transistor T5 and the first electrode of the light emitting device L in the first pixel circuit D1 is approximately the same as the parasitic capacitance on a path along the second electrode of the driving transistor T2, the first light emission control transistor T5 and the first electrode of the light emitting device L in the second pixel circuit D2, which is beneficial for maintaining consistency between the parasitic capacitance of the first pixel circuit D1 and the parasitic capacitance of the second pixel circuit D2.

In some specific embodiments, the at least one pixel circuit D further includes a second light emission control transistor T6. In the at least one pixel circuit D, the second light emission control transistor T6 has a first electrode electrically connected to the at least one first power line VDDL, a second electrode electrically connected to the first electrode of the driving transistor T2, and a gate electrode electrically connected to the light emission control signal line EM.

For the at least one column of pixel circuits D, the second light emission control transistor T6 of the first pixel circuit D1 after being translated in the second direction Y may be mirror symmetrical with the second light emission control transistor T6 of the second pixel circuit D2 about the first axis. In this way, the parasitic capacitance on a path along the first power line VDDL, the second light emission control transistor T6 and the first electrode of the driving transistor T2 in the first pixel circuit D1 is approximately the same as the parasitic capacitance on a path along the first power line VDDL, the second light emission control transistor T6 and the first electrode of the driving transistor T2 in the second pixel circuit D2, which is beneficial for maintaining consistency between the parasitic capacitance of the first pixel circuit D1 and the parasitic capacitance of the second pixel circuit D2.

In some specific embodiments, the display substrate further includes at least one second reset signal line V2 located in the third conductive layer SD3 and at least one third scanning signal line RE2 located in the first conductive layer SD1, and the at least one sub-pixel further includes a second reset transistor T7.

In some specific embodiments, in the at least one pixel circuit D, the second reset transistor T7 has a first electrode electrically connected to the at least one second reset signal line V2, a second electrode electrically connected to the first electrode of the light emitting device L, and a gate electrode electrically connected to the at least one third scanning signal line RE2.

For the at least one column of pixel circuits D, the second reset transistor T7 of the first pixel circuit D1 after being translated in the second direction Y may be mirror symmetrical with the second reset transistor T7 of the second pixel circuit D2 about the first axis. In this way, the parasitic capacitance on a path along the second reset signal line V2, the second reset transistor T7 and the first electrode of the light emitting device L in the first pixel circuit D1 is approximately the same as the parasitic capacitance on a path along the second reset signal line V2, the second reset transistor T7 and the first electrode of the light emitting device L in the second pixel circuit D2, which is beneficial for maintaining consistency between the parasitic capacitance of the first pixel circuit D1 and the parasitic capacitance of the second pixel circuit D2. In some specific embodiments, the display substrate further includes at least one third reset signal line V3 located in the third conductive layer SD3 and at least one third scanning signal line RE2 located in the first conductive layer SD1, and the at least one pixel circuit D further includes a third reset transistor T8. In the at least one pixel circuit D, the third reset transistor T8 has a first electrode electrically connected to the at least one third reset signal line V3, a second electrode electrically connected to the first electrode of the driving transistor T2, and a gate electrode electrically connected to the at least one third scanning signal line RE2.

For the at least one column of pixel circuits D, the third reset transistor T8 of the first pixel circuit D1 after being translated in the second direction Y may be mirror symmetrical with the third reset transistor T8 of the second pixel circuit D2 about the first axis. In this way, the parasitic capacitance on a path along the third reset signal line V3, the third reset transistor T8 and the first electrode of the driving transistor T2 in the first pixel circuit D1 is approximately the same as the parasitic capacitance on a path along the third reset signal line V3, the third reset transistor T8 and the first electrode of the driving transistor T2 in the second pixel circuit D2, which is beneficial for maintaining consistency between the parasitic capacitance of the first pixel circuit D1 and the parasitic capacitance of the second pixel circuit D2.

Figure 7:
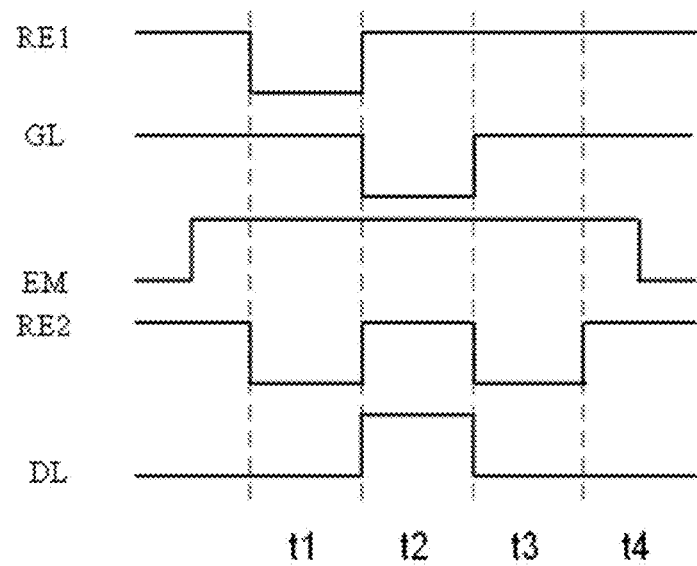
FIG. 7 schematically shows a driving timing diagram of a pixel circuit in embodiments of the present disclosure.

FIG. 7 schematically shows a driving timing diagram of a pixel circuit in embodiments of the present disclosure. Referring to FIG. 7, in embodiments of the present disclosure, the pixel circuit D includes at least a first reset stage t1, a data writing stage t2, a second reset stage t3, and a light emitting stage t4.

In the first reset stage t1, a valid level signal is provided to the second scanning signal line RE1 and the third scanning signal line RE2. At this time, the first reset transistor T3, the second reset transistor T7 and the third reset transistor T8 are turned on to reset the first electrode of the driving transistor T2, the gate electrode of the driving transistor T2, and the first electrode of the light emitting device L.

In the data writing stage t2, an invalid level signal is provided to the second scanning signal line RE1 and the third scanning signal line RE2, and a valid level signal is provided to the first scanning signal line. At this time, the first reset transistor T3, the second reset transistor T7 and the third reset transistor T8 are turned off, and the input transistor T1, the driving transistor T2 and the threshold compensation transistor T4 are turned on. A data voltage signal on the data line DL passes through the input transistor T1, the driving transistor T2 and the threshold compensation transistor T4, and is written to the storage capacitor CT. When a difference between a gate voltage and a source voltage of the driving transistor T2 is greater than or equal to a threshold voltage, the driving transistor T2 is turned off. At this time, the threshold voltage of the driving transistor T2 is read out and written to the storage capacitor CT.

In the second reset stage t3, an invalid level signal is provided to the first scanning signal line GL, and a valid level signal is provided to the third scanning signal line RE2. At this time, the input transistor T1, the driving transistor T2 and the threshold compensation transistor T4 are turned off, and the second reset transistor T7 and the third reset transistor T8 are turned on, so as to reset the first electrode of the driving transistor T2 and the first electrode of the light emitting device L before the light emitting stage t4.

In the light emitting stage t4, an invalid level signal is provided to the third scanning signal line RE2, and a valid level signal is provided to the light emission control signal line EM. At this time, the second reset transistor T7 and the third reset transistor T8 are turned off, and the first light emission control transistor T5 and the second light emission control transistor T6 are turned on. In response to a voltage difference between the gate electrode and the first electrode of the driving transistor T2, the driving transistor T2 provides a driving current to the first electrode of the light emitting device L, so as to drive the light emitting device L to emit light. As the threshold voltage of the driving transistor T2 is written to the storage capacitor CT, the threshold voltage may be offset when the driving current is generated by the driving transistor T2, so that an adverse effect caused by a drift of the threshold voltage may be prevented.

In embodiments of the present disclosure, the first electrode of the driving transistor T2 may be reset by the third reset transistor T8, so that a low frequency flicker problem may be improved, and a low frequency driving such as 40 Hz may be achieved.

Based on a pixel circuit D, a layout design of the pixel circuit D in embodiments of the present disclosure will be described below with reference to FIG. 3, FIG. 4 and FIG. 8 to FIG. 24. It should be understood that, unless otherwise specified, all signal lines mentioned below refer to signal lines electrically connected to one and same pixel circuit D.

In some specific embodiments, the semiconductor layer ACT may be made of amorphous silicon, polycrystalline silicon, oxide semiconductor, or other materials. The input transistor T1 may include a first electrode, a second electrode, a gate electrode G1, and an active layer A1. The active layer A1 of the input transistor T1 of the at least one pixel circuit D is located in the semiconductor layer ACT. Referring to FIG. 8, the active layer A1 of the input transistor T1 may include a first electrode connecting portion, a second electrode connecting portion, and a channel portion located between the first electrode connecting portion and the second electrode connecting portion. The channel portion of the input transistor T1 is directly opposite to the gate electrode G1 of the input transistor T1.

Optionally, in addition to the input transistor T1, all other transistors of the pixel circuit D have a first electrode, a second electrode, a gate electrode, and an active layer. The active layers of other transistors of the pixel circuit D may be located in the semiconductor layer ACT. For example, as shown in FIG. 8, an active layer A2 of the driving transistor T2, an active layer A3 of the first reset transistor T3, an active layer A4 of the threshold compensation transistor T4, an active layer A5 of the first light emission control transistor T5, an active layer A6 of the second light emission control transistor T6, an active layer A7 of the second reset transistor T7 and an active layer A8 of the third reset transistor T8 are all located in the semiconductor layer ACT, and each of the active layer A2 of the driving transistor T2, the active layer A3 of the first reset transistor T3, the active layer A4 of the threshold compensation transistor T4, the active layer A5 of the first light emission control transistor T5, the active layer A6 of the second light emission control transistor T6, the active layer A7 of the second reset transistor T7 and the active layer A8 of the third reset transistor T8 has a first electrode connecting portion, a second electrode connecting portion, and a channel portion located between the first electrode connecting portion and the second electrode connecting portion. The channel portion of each transistor is directly opposite to the gate electrode of the transistor.

In some specific embodiments, the first gate metal layer GT1 may be made of a metal material, such as Mo, Al, Cu, etc. and alloys thereof. The gate electrode G1 of the input transistor T1 of the at least one pixel circuit D is located in the first gate metal layer GT1. Optionally, in addition to the gate electrode G1 of the input transistor T1, the gate electrodes G1 of other transistors of the pixel circuit D are also located in the first gate metal layer GT1. For example, as shown in FIG. 9, a gate electrode G2 of the driving transistor T2, a gate electrode G3 of the first reset transistor T3, a gate electrode G7 of the second reset transistor T7, a gate electrode G8 of the third reset transistor T8, a gate electrode G5 of the first light emission control transistor T5 and a gate electrode G6 of the second light emission control transistor T6 are all located in the first gate metal layer GT1.

Optionally, the light emission control signal line EM is located in the first gate metal layer GT1. For example, the light emission control signal line EM extends in the first direction X, and in the second direction Y, an orthographic projection of the light emission control signal line EM on the base substrate 100 is located between an orthographic projection of the gate electrode G2 of the driving transistor T2 on the base substrate 100 and an orthographic projection of the gate electrode G7 of the second reset transistor T7 on the base substrate 100.

Optionally, the first electrode plate of the storage capacitor CT may also be located in the first gate metal layer GT1. For example, the first electrode plate of the storage capacitor CT and the gate electrode G1 of the driving transistor T2 may be formed as an integral structure.

Referring to FIG. 10, in some specific embodiments, the first electrode S11 of the input transistor T1 of the at least one pixel circuit D is located in the first conductive layer SD1. In an example, the second electrode (not shown) of the input transistor T1 of the at least one pixel circuit D is located in the first conductive layer SD1. In another example, the semiconductor layer ACT may be doped through a mask, so that a masked portion of the semiconductor layer ACT forms the active layer A1 of the input transistor T1, and an unmasked portion of the semiconductor layer ACT forms a conductor that may form the second electrode of the input transistor T1.

Optionally, the first scanning signal line GL, the second scanning signal line RE1 and the third scanning signal line RE2 may be located in the first conductive layer SD1. The first scanning signal line GL, the second scanning signal line RE1 and the third scanning signal line RE2 may be arranged in the second direction Y. For example, in the second direction Y, an orthographic projection of the first scanning signal line GL on the base substrate 100 is located between an orthographic projection of the second scanning signal line RE1 on the base substrate 100 and an orthographic projection of the third scanning signal line RE2 on the base substrate 100.

Optionally, in the at least one pixel circuit D, in addition to the input transistor T1, the first electrodes (or second electrodes) of other transistors may also be located in the first conductive layer SD1. For example, a first electrode S31 of the first reset transistor T3, a second electrode S42 of the threshold compensation transistor T4, a second electrode S52 of the first light emission control transistor T5, a first electrode S61 of the second light emission control transistor T6, a second electrode S62 of the second light emission control transistor T6, a first electrode S71 of the second reset transistor T7, a first electrode S81 of the third reset transistor T8 and a second electrode S82 of the third reset transistor T8 may be located in the first conductive layer SD1. Alternatively, the first electrodes (or second electrodes) of the transistors may also be formed by doping conductive materials in the semiconductor layer.

Referring to FIG. 11, in some specific embodiments, the at least one first power line VDDL and the at least one data line DL are located in the second conductive layer SD2. The first power line VDDL and the data line DL may be arranged in the first direction X. For example, an orthographic projection of the first power line VDDL on the base substrate 100 is located between an orthographic projection of the first data line DL1 on the base substrate 100 and an orthographic projection of the second data line DL2 on the base substrate 100.

Referring to FIG. 12, in some specific embodiments, a plurality of power leads YL are provided in the third conductive layer SD3, and the at least one first power line VDDL is electrically connected to a high-level power terminal through at least one power lead YL. The plurality of power leads YL may be arranged in the first direction X. Optionally, an orthographic projection of each power lead YL on the base substrate 100 may overlap at least partially with the orthographic projection of a first power line VDDL on the base substrate 100.

Optionally, the first reset signal line V1, the second reset signal line V2 and the third reset signal line V3 may be located in the third conductive layer SD3. The first reset signal line V1, the second reset signal line V2, the third reset signal line V3, and the power leads YL may be arranged in the first direction X. For example, an orthographic projection of the first reset signal line V1 on the base substrate 100, an orthographic projection of the second reset signal line V2 on the base substrate 100, and an orthographic projection of the third reset signal line V3 on the base substrate 100 are separated by orthographic projections of the power lead YL on the base substrate 100.

Optionally, the first reset signal line V1, the second reset signal line V2, and the third reset signal line V3 may be multiplexed by a pixel unit P. For example, a pixel unit includes three sub-pixels, and the pixel circuits D of the three sub-pixels are electrically connected to one and same first reset signal line V1. Correspondingly, the pixel circuits D of the three sub-pixels are also electrically connected to one and same second reset signal line V2 and one and same third reset signal line V3.

In some specific embodiments, the display substrate further includes an insulation layer located between various conductive film layers. For example, as shown in FIG. 13, the display substrate further includes an interlayer insulation layer ILD located between the first gate metal layer GT1 and the first conductive layer SD1. The interlayer insulation layer ILD is provided with a plurality of via holes penetrating the interlayer insulation layer ILD. The plurality of via holes in the interlayer insulation layer ILD may be communicated with via holes in other insulation layers, so that a film layer (such as a semiconductor layer) located between the first conductive layer SD1 and the base substrate 100 may be electrically connected to a conductive structure of the first conductive layer SD1 through the via holes. For clarity, the interlayer insulation layer ILD is taken as an example in embodiments of the present disclosure to illustrate the via holes. For example, the interlayer insulation layer ILD is provided with fourth via holes H1 to H18 penetrating the interlayer insulation layer ILD.

Referring to FIG. 8 to FIG. 14, the first electrode S31 of the first reset transistor T3 is electrically connected to a first reset lead V11 through a first via hole H1, the gate electrode G1 of the first reset transistor T3 is electrically connected to the second scanning signal line RE1 through a fourth via hole V4, and the active layer A3 of the first reset transistor T3 is electrically connected to the first electrode S31 through a seventh via hole V7. The first reset lead V11 is electrically connected to a first conductive portion F1 in the first conductive layer SD1 through an eighth via hole H8, and is further electrically connected to the first reset signal line V1 in the third conductive layer SD3 through the first conductive portion F1.

The active layer A1 of the input transistor T1 is electrically connected to the first electrode S11 through a ninth via hole H9, and the gate electrode G1 of the input transistor T1 is electrically connected to the first scanning signal line GL through a fifth via hole H5.

The gate electrode G4 of the threshold compensation transistor T4 is electrically connected to the first scanning signal line GL through a fifth via hole H5, the active layer A4 of the threshold compensation transistor T4 is electrically connected to the second electrode S42 through an eleventh via hole H11, and the second electrode S42 of the threshold compensation transistor T4 is further electrically connected to the gate electrode G2 of the driving transistor T2 through a twelfth via hole.

The active layer A5 of the first light emission control transistor T5 is electrically connected to the second electrode S52 of the first light emission control transistor T5 through a thirteenth via hole H13.

The active layer A6 of the second light emission control transistor T6 is electrically connected to the second electrode S62 of the second light emission control transistor T6 through a fourteenth via hole H14, and is electrically connected to the first electrode S61 of the second light emission control transistor T6 through a sixth via hole H6.

The active layer A7 of the second reset transistor T7 is electrically connected to the first electrode S71 of the second reset transistor T7 through an eighteenth via hole H18, and the first electrode S71 of the second reset transistor T7 is electrically connected to a second reset lead V21 through a second via hole H2.

The active layer A8 of the third reset transistor T8 is electrically connected to the first electrode S81 of the third reset transistor T8 through a seventeenth via hole H17, and the first electrode S81 of the third reset transistor T8 is electrically connected to a third reset lead V31 through a third via hole H3.

It should be noted that the first reset lead V11, the second reset lead V12 and the third reset lead V13 are located in the second gate metal layer GT2, which will be described in detail below and will not be repeated here.

It should also be noted that the via holes are explained above with the first pixel circuit D1 as an example. The via holes in the second pixel circuit D2 may be designed to be substantially mirror symmetrical with the via holes in the first pixel circuit D1 about the first axis, and details of which will not be repeated here.

It should also be noted that, in addition to the via holes, patterns of various film layers in the first pixel circuit D1 are also designed to be substantially mirror symmetrical with patterns of various film layers in the second pixel circuit D2 about the first axis, so that the parasitic capacitance of the first pixel circuit D1 may be substantially the same as the parasitic capacitance of the second pixel circuit D2.

Referring to FIG. 15, in some specific embodiments, the at least one pixel circuit D further includes a shielding electrode E. For the at least one pixel circuit D and the data line DL electrically connected to the pixel circuit D, an orthographic projection of the shielding electrode E on the base substrate 100 is located between the orthographic projection of the first data line DL1 on the base substrate 100 and the orthographic projection of the threshold compensation transistor T4 on the base substrate 100, and a layer where the shielding electrode E is located is between a layer where the data line DL is located and a layer where the threshold compensation transistor T4 is located. For example, the display substrate further includes a second gate metal layer GT2 located between the first gate metal layer GT1 and the first conductive layer SD1, and the at least one pixel circuit D further includes a shielding electrode E located in the second gate metal layer GT2.

In embodiments of the present disclosure, the second electrode plate of the storage capacitor CT may be located in the second gate metal layer GT2, the shielding electrode E and the second electrode plate C2 of the storage capacitor CT may be formed as an integral structure, and the second electrode plate C2 of the storage capacitor CT is electrically connected to the first power line VDDL, so that the shielding electrode E may be provided with a constant power signal, and an interference of an electrical signal on the first data line DL1 to other elements may be shielded. For example, for a connecting node for the second electrode of the first reset transistor T3, the second electrode S42 of the threshold compensation transistor T4 and the gate electrode G2 of the driving transistor T2, the interference of the electrical signal on the first data line DL1 to the node may be shielded through the shielding electrode E.

Referring to FIG. 14 and FIG. 15 in combination, the interlayer insulation layer ILD is further provided with a thirty-first via hole H31, and a third conductive portion F3 in the first conductive layer SD1 is electrically connected to the second electrode plate C2 of the storage capacitor in the second gate metal layer GT2 through the thirty-first via hole H31. Optionally, the third conductive portion F3 is further electrically connected to the first power line VDDL, so that an electrical connection between the second electrode plate C2 of the storage capacitor and the first power line VDDL may be achieved.

Optionally, a plurality of reset leads are further provided in the second gate metal layer GT2 to connect the pixel circuits D of sub-pixels in one and same pixel unit to one and same first reset signal line V1 (second reset signal line V2 or third reset signal line V3), which will be described in detail below and will not be repeated here.

Referring to FIG. 16, in some specific embodiments, the display substrate further includes a first insulation layer R1 located between the first conductive layer SD1 and the second conductive layer SD2. The first insulation layer R1 is provided with a plurality of via holes, and various conductive structures in the first conductive layer SD1 may be electrically connected to conductive structures in the second conductive layer SD2 through the via holes. For example, the first insulation layer R1 is provided with a nineteenth via hole H19 to a twenty-fourth via hole H24.

Referring to FIG. 8 to FIG. 16, the first conductive portion F1 is electrically connected to the second conductive portion F2 located in the second conductive layer SD2 through the nineteenth via hole H19, and is further electrically connected to the first reset signal line V1 located in the third conductive layer SD3 through the second conductive portion F2.

The first electrode S11 of the input transistor T1 is electrically connected to the data line DL located in the second conductive layer SD2 through a twentieth via hole.

The first electrode S61 of the second light emission control transistor T6 is electrically connected to the first power line VDDL through a twenty-first via hole H21. Optionally, the plurality of first power lines VDDL are electrically connected through the third conductive portion F3 located in the second conductive layer SD2, so that the plurality of first power lines VDDL are connected in parallel so as to reduce a resistance on the first power line VDDL.

Optionally, the first electrode S61 of the second light emission control transistor T6 and the third conductive portion F3 are formed as an integral structure.

The second electrode S52 of the first light emission control transistor T5 is electrically connected to a transfer portion W located in the second conductive layer SD2 through a twenty-second via hole H22, and is further electrically connected to the first electrode of the light emitting device through the transfer portion W.

The first electrode S71 of the second reset transistor T7 is electrically connected to a fourth conductive portion F4 located in the second conductive layer SD2 through a twenty-third via hole H23, and is further electrically connected to the second reset signal line V2 located in the third conductive layer SD3 through the fourth conductive portion F4.

For a plurality of pixel circuits D adjacent in the first direction X, the first electrode S71 of the second reset transistors T7 of one of the plurality of pixel circuits D is electrically connected to the fourth conductive portion F4 located in the second conductive layer SD2 through the twenty-third via hole H23, and is further electrically connected to the second reset signal line V2 located in the third conductive layer SD3 through the fourth conductive portion F4. As the first electrode S71 of the third reset transistor T7 is further electrically connected to the second reset lead V21, an electrical connection between the second reset lead V21 and the second reset signal line V2 may be achieved through the twenty-third via hole H23 and the fourth conductive portion F4.

For a plurality of pixel circuits D adjacent in the first direction X, the first electrode S81 of the third reset transistors T8 of one of the plurality of pixel circuits D is electrically connected to a fifth conductive portion F5 located in the second conductive layer SD2 through a twenty-fourth via hole H24, and is further electrically connected to the third reset signal line V3 located in the third conductive layer SD3 through the fifth conductive portion F5. As the first electrode S81 of the third reset transistor T8 is further electrically connected to the third reset lead V31, an electrical connection between the third reset lead V31 and the third reset signal line V3 may be achieved through the twenty-fourth via hole H24 and the fifth conductive portion F5.

In some specific embodiments, the display substrate further includes a second insulation layer R2 located between the second conductive layer SD2 and the third conductive layer SD3. The second insulation layer R2 is provided with a plurality of via holes, and the various conductive structures in the second conductive layer SD2 may be electrically connected to conductive structures in the third conductive layer SD3 through the via holes. For example, the second insulation layer R2 is provided with a twenty-fifth via hole H25 to a twenty-ninth via hole H29.

Exemplarily, the second conductive portion F2 is electrically connected to the first reset signal line V1 through the twenty-fifth via hole H25.

The transfer portion W is electrically connected to a sixth conductive portion F6 located in the third conductive layer SD3 through a twenty-sixth via hole H26, and is further electrically connected to the first electrode of the light emitting device L through the sixth conductive portion F6.

The first power line VDDL is electrically connected to the first power lead YL1 through a twenty-seventh via hole H27.

The fourth conductive portion F4 is electrically connected to the second reset signal line V2 through a twenty-eighth via hole H28, and an electrical connection between the second reset lead V21 and the second reset signal line V2 may be achieved through the fourth conductive portion F4.

The fifth conductive portion F5 is electrically connected to the third reset signal line V3 through a twenty-ninth via hole H29, and an electrical connection between the third reset lead V31 and the third reset signal line V3 may be achieved through the fifth conductive portion F5.

Referring to FIG. 8 to FIG. 19 in combination, in some specific embodiments, for the at least one pixel circuit D and the first power line VDDL electrically connected to the pixel circuit D, the orthographic projection of the driving transistor T2 on the base substrate 100 overlaps at least partially with the orthographic projection of the first power line VDDL on the base substrate 100. For example, the orthographic projection of the gate electrode G2 of the driving transistor T2 on the base substrate 100 is located in a range of the orthographic projection of the first power line VDDL on the base substrate 100.

In embodiments of the present disclosure, in the second direction Y, the orthographic projection of the driving transistor T2 on the base substrate 100 is located between the orthographic projection of the first scanning signal line GL on the base substrate 100 and the orthographic projection of the light emission control signal line EM on the base substrate 100.

In some specific embodiments, for the at least one pixel circuit D and the first power line VDDL electrically connected to the pixel circuit D, the orthographic projection of the first reset transistor T3 on the base substrate 100 overlaps at least partially with the orthographic projection of the first power line VDDL on the base substrate 100. For example, the orthographic projection of the active layer A3 of the first reset transistor T3 on the base substrate 100 is located in a range of the orthographic projection of the first power line VDDL on the base substrate 100.

Optionally, the orthographic projection of the first reset transistor T3 on the base substrate 100 is located on a side of the orthographic projection of the first scanning signal line GL on the base substrate 100 away from the orthographic projection of the light emission control signal line EM on the base substrate 100.

Optionally, a dual gate structure may be adopted for the first reset transistor T3, and orthographic projections of two gate electrodes G3 of the first reset transistor T3 on the base substrate 100 are arranged in the second direction Y. The two gate electrodes G3 of the first reset transistor T3 and a connection structure between the two may have a substantially "U" shape, and an opening of the "U" shape faces the first power line VDDL. For example, for the first pixel circuit D1, the opening of the gate electrode G3 of the first reset transistor T3 faces left, while for the second pixel circuit D, the opening of the gate electrode G3 of the first reset transistor T3 faces right.

In some specific embodiments, for the at least one column of pixel circuits D, the data lines DL electrically connected to the column of pixel circuits D, and the first power line VDDL electrically connected to the column of pixel circuits D, an orthographic projection of at least part of the threshold compensation transistor T4 of the first pixel circuit D1 on the base substrate 100 is located between the orthographic projection of the first power line VDDL on the base substrate 100 and the orthographic projection of the second data line DL2 on the base substrate 100, and an orthographic projection of at least part of the threshold compensation transistor T4 of the second pixel circuit D2 on the base substrate 100 is located between the orthographic projection of the first power line VDDL on the base substrate 100 and the orthographic projection of the first data line DL1 on the base substrate 100.

For example, an orthographic projection of a part of the active layer A4 of the threshold compensation transistor T4 of the first pixel circuit D1 on the base substrate 100 is located between the orthographic projection of the first power line VDDL on the base substrate 100 and the orthographic projection of the second data line DL2 on the base substrate 100, and an orthographic projection of the second electrode S42 of the threshold compensation transistor T4 of the first pixel circuit D1 on the base substrate 100 is located in a range of the orthographic projection of the first power line VDDL on the base substrate 100. An orthographic projection of a part of the active layer A4 of the threshold compensation transistor T4 of the second pixel circuit D2 on the base substrate 100 is located between the orthographic projection of the first power line VDDL on the base substrate 100 and the orthographic projection of the first data line DL1 on the base substrate 100, and an orthographic projection of the second electrode S42 of the threshold compensation transistor T4 of the second pixel circuit D2 on the base substrate 100 is located in a range of the orthographic projection of the first power line VDDL on the base substrate 100.

Optionally, the orthographic projection of the input transistor T1 on the base substrate 100 and the orthographic projection of the threshold compensation transistor T4 on the base substrate 100 are arranged in the first direction X.

Optionally, in the second direction Y, the orthographic projection of the input transistor T1 on the base substrate 100 and the orthographic projection of the threshold compensation transistor T4 on the base substrate 100 are located between the orthographic projection of the first reset transistor T3 on the base substrate 100 and the orthographic projection of the driving transistor T2 on the base substrate 100.

In some specific embodiments, for the at least one pixel circuit D and the first power line VDDL electrically connected to the pixel circuit D, the threshold compensation transistor T4 has a dual gate structure. An orthographic projection of one gate electrode G4 on the base substrate 100 overlaps at least partially with the orthographic projection of the first power line VDDL on the base substrate 100, and an orthographic projection of the other gate electrode G4 on the base substrate 100 is spaced at least partially from the orthographic projection of the first power line VDDL on the base substrate 100.

For example, the threshold compensation transistor T4 of the pixel circuit D includes a first gate electrode G41 and a second gate electrode G42. An orthographic projection of the first gate electrode G41 of the threshold compensation transistor T4 of the first pixel circuit D1 on the base substrate 100 overlaps partially with the orthographic projection of the first power line VDDL on the base substrate 100, and an orthographic projection of the second gate electrode G42 on the base substrate 100 is located between the orthographic projection of the first power line VDDL on the base substrate 100 and the orthographic projection of the second data line DL2 on the base substrate 100. An orthographic projection of the first gate electrode G41 of the threshold compensation transistor T4 of the second pixel circuit D2 on the base substrate 100 overlaps partially with the orthographic projection of the first power line VDDL on the base substrate 100, and an orthographic projection of the second gate electrode G42 on the base substrate 100 is located between the orthographic projection of the first power line VDDL on the base substrate 100 and the orthographic projection of the first data line DL1 on the base substrate 100.

For two pixel circuits D adjacent in the first direction X, the gate electrode G4 of the threshold compensation transistor T4 of a previous pixel circuit D and the input transistor T1 of a subsequent pixel circuit D are electrically connected to the first scanning signal line GL through one and same fifth via hole H5.

Optionally, in the at least one pixel circuit D, an orthographic projection of the fifth via hole H5 on the base substrate 100 overlaps at least partially with at least one of the orthographic projection of the first reset signal line V1 on the base substrate 100, the orthographic projection of the second reset signal line V2 the base substrate 100, and the orthographic projection of the third reset signal line V3 on the base substrate 100. For example, a pixel unit may include three sub-pixels. For three pixel circuits D in the pixel unit, the orthographic projection of the fifth via hole H5 of a leftmost pixel circuit D on the base substrate 100 overlaps at least partially with the orthographic projection of the first reset signal line V1 on the base substrate 100, the orthographic projection of the fifth via hole H5 of a middle pixel circuit D on the base substrate 100 overlaps at least partially with the orthographic projection of the second reset signal line V2 on the base substrate 100, and the orthographic projection of the fifth via hole H5 of a rightmost pixel circuit D on the base substrate 100 overlaps at least partially with the orthographic projection of the third reset signal line V3 on the base substrate 100.

In some specific embodiments, for the at least one column of pixel circuits D, the data lines DL electrically connected to the column of pixel circuits D, and the first power line VDDL electrically connected to the column of pixel circuits D, the orthographic projection of the first light emission control transistor T5 of the first pixel circuit D1 on the base substrate 100 is located between the orthographic projection of the first power line VDDL on the base substrate 100 and the orthographic projection of the second data line DL2 on the base substrate 100, and the orthographic projection of the first light emission control transistor T5 of the second pixel circuit D2 on the base substrate 100 is located between the orthographic projection of the first power line VDDL on the base substrate 100 and the orthographic projection of the first data line DL1 on the base substrate 100.

Optionally, for either of the first pixel circuit D1 and the second pixel circuit D2, in the second direction Y, the orthographic projection of the first light emission control transistor T5 on the base substrate 100 is located between the orthographic projection of the driving transistor T2 on the base substrate 100 and the orthographic projection of the second scanning signal line RE1 on the base substrate 100.

In some specific embodiments, for the at least one pixel circuit D and the first power line VDDL electrically connected to the pixel circuit D, the orthographic projection of the second light emission control transistor T6 on the base substrate 100 overlaps at least partially with the orthographic projection of the first power line VDDL on the base substrate 100.

For example, the orthographic projection of the first electrode S61 of the second light emission control transistor T6 of the first pixel circuit D1 on the base substrate 100 is located in a range of the orthographic projection of the first power line VDDL on the base substrate 100, and the orthographic projection of the second electrode S62 of the second light emission control transistor T6 of the first pixel circuit D1 on the base substrate 100 is located between the orthographic projection of the first power line VDDL on the base substrate 100 and the orthographic projection of the first data line DL1 on the base substrate 100. The orthographic projection of the first electrode S61 of the second light emission control transistor T6 of the second pixel circuit D2 on the base substrate 100 is located in a range of the orthographic projection of the first power line VDDL on the base substrate 100, and the orthographic projection of the second electrode S62 of the second light emission control transistor T6 of the second pixel circuit D2 on the base substrate 100 is located between the orthographic projection of the first power line VDDL on the base substrate 100 and the orthographic projection of the second data line DL2 on the base substrate 100.

In some specific embodiments, in at least one sub-pixel, the orthographic projection of the second light emission control transistor T6 on the base substrate 100 and the orthographic projection of the first light emission control transistor T5 on the base substrate 100 are arranged in the first direction X.

In some specific embodiments, the display substrate further includes a first insulation layer R1 located between the first conductive layer SD1 and the second conductive layer SD2, and the first insulation layer R1 is provided with a sixth via hole H6 penetrating the first insulation layer R1. For the at least one pixel circuit D and the first power line VDDL electrically connected to the pixel circuit D, the first electrode S61 of the second light emission control transistor T6 is located in the first conductive layer SD1, the first electrode S61 of the second light emission control transistor T6 is electrically connected to the first power line VDDL through the sixth via hole H6, and an orthographic projection of the sixth via hole H6 on the base substrate 100 is located in a range of the orthographic projection of the first power line VDDL on the base substrate 100.

In some specific embodiments, the at least one pixel circuit D further includes a transfer portion W. For the at least one pixel circuit D and the first power line VDDL electrically connected to the pixel circuit D, the second electrode S52 of the first light emission control transistor T5 is electrically connected to the first electrode of the light emitting device L through the transfer portion W. For the at least one column of pixel circuits D, the data lines DL electrically connected to the column of pixel circuits D, and the first power line VDDL electrically connected to the column of pixel circuits D, an orthographic projection of the transfer portion W of the first pixel circuit D1 on the base substrate 100 is located on a side of the orthographic projection of the first power line VDDL on the base substrate 100 close to the orthographic projection of the second data line DL2 on the base substrate 100, and an orthographic projection of the transfer portion W of the second pixel circuit D2 on the base substrate 100 is located on a side of the orthographic projection of the first power line VDDL on the base substrate 100 close to the orthographic projection of the first data line DL1 on the base substrate 100. In other words, for each pixel circuit D1, the orthographic projection of the transfer portion W on the base substrate 100 is located between the orthographic projection of the first light emission control transistor T5 on the base substrate 100 and the orthographic projection of the first power line VDDL on the base substrate 100.

In embodiments of the present disclosure, the light emitting device L has a cathode, an anode, and an electroluminescent layer located between the cathode and the anode. The first electrode of the light emitting device L may refer to the anode of the light emitting device L, that is, the second electrode S52 of the first light emission control transistor T5 is electrically connected to the anode of the light emitting device L through the transfer portion W. Optionally, the aforementioned power lead YL may include a first power lead YL1 and a second power lead YL2. The first power line VDDL may be electrically connected to the high-level power terminal through the first power lead YL1, and the cathode of the light emitting device L may be electrically connected to a low-level power terminal through the second power lead YL2.

Optionally, in the at least one pixel circuit D, in the second direction Y, the orthographic projection of the transfer portion W on the base substrate 100 is located between the orthographic projection of the driving transistor T2 on the base substrate 100 and the orthographic projection of the second scanning signal line RE1 on the base substrate 100.

In some specific embodiments, for the at least one column of pixel circuits D, the data lines DL electrically connected to the column of pixel circuits D, and the first power line VDDL electrically connected to the column of pixel circuits D, an orthographic projection of the second reset transistor T7 of the first pixel circuit D1 on the base substrate 100 is located between the orthographic projection of the first power line VDDL on the base substrate 100 and the orthographic projection of the second data line DL2 on the base substrate 100, and an orthographic projection of the second reset transistor T7 of the second pixel circuit D2 on the base substrate 100 is located between the orthographic projection of the first power line VDDL on the base substrate 100 and the orthographic projection of the first data line DL1 on the base substrate 100.

Optionally, in the at least one pixel circuit D, in the second direction Y, the orthographic projection of the second reset transistor T7 on the base substrate 100 is located on a side of the orthographic projection of the first light emission control transistor T5 on the base substrate 100 away from the orthographic projection of the driving transistor T2 on the base substrate 100.

Optionally, the orthographic projection of the second reset transistor T7 on the base substrate 100 and the orthographic projection of the first light emission control transistor T5 on the base substrate 100 are arranged in the second direction Y.

In some specific embodiments, for the at least one column of pixel circuits D, the data lines DL electrically connected to the column of pixel circuits D, and the first power line VDDL electrically connected to the column of pixel circuits D, an orthographic projection of the third reset transistor T8 of the first pixel circuit D1 on the base substrate 100 is located between the orthographic projection of the first power line VDDL on the base substrate 100 and the orthographic projection of the first data line DL1 on the base substrate 100, and an orthographic projection of the third reset transistor T8 of the second pixel circuit D2 on the base substrate 100 is located between the orthographic projection of the first power line VDDL on the base substrate 100 and the orthographic projection of the second data line DL2 on the base substrate 100.

Optionally, in the at least one pixel circuit D, in the second direction Y, the orthographic projection of the third reset transistor T8 on the base substrate 100 is located on a side of the orthographic projection of the second light emission control transistor T6 on the base substrate 100 away from the orthographic projection of the driving transistor T2 on the base substrate 100.

Optionally, the orthographic projection of the third reset transistor T8 on the base substrate 100 and the orthographic projection of the second light emission control transistor T6 on the base substrate 100 are arranged in the second direction Y.

In some specific embodiments, the display substrate further includes at least one light emission control signal line EM located in the first gate metal layer GT1, and the at least one pixel circuit D further includes a first connecting portion located in the first conductive layer SD1. In the at least one pixel circuit D, the second electrode S82 of the third reset transistor T8 is electrically connected to the first electrode of the driving transistor T2 (or to the second electrode S62 of the second light emission control transistor T6) through the first connecting portion M1, and an orthographic projection of the first connecting portion M1 on the base substrate 100 overlaps with the orthographic projection of the at least one light emission control signal line EM on the base substrate 100. For example, the light emission control signal line EM extends in the first direction X, the third reset transistor T8 and the driving transistor T2 are respectively located on two sides of the light emission control signal line EM in the second direction Y, and the second electrode S82 of the third reset transistor T8 is electrically connected to the first electrode of the driving transistor T2 through the first connecting portion M1 across the light emission control signal line EM.

Referring to FIG. 20, in some specific embodiments, the display substrate further includes a first shielding layer Q located on a side of a layer where the input transistor T1 layer is located close to the base substrate 100. For example, the first shielding layer Q is located on a side of the semiconductor layer ACT close to the base substrate 100. An orthographic projection of the first shielding layer Q on the base substrate 100 covers the orthographic projections of the driving transistor T2 and the first reset transistor T3 of the at least one pixel circuit D on the base substrate 100. In this way, it is possible to prevent light from illuminating channels of the driving transistor T2 and the first reset transistor T3, thereby avoiding problems such as a resulting leakage current.

In some specific embodiments, the at least one pixel circuit D further includes a threshold compensation transistor T4, and the orthographic projection of the first shielding layer Q on the base substrate 100 covers the orthographic projections of the driving transistor T2, the first reset transistor T3 and the threshold compensation transistor T4 of the at least one pixel circuit D on the base substrate 100. In this way, it is also possible to prevent light from illuminating the channel of the threshold compensation transistor T4, thereby avoiding problems such as the resulting leakage current.

In embodiments of the present disclosure, the first shielding layer Q includes a first blocking portion and a second blocking portion that are arranged in the second direction Y. An orthographic projection of the first blocking portion on the base substrate 100 covers the orthographic projection of the threshold compensation transistor T4 on the base substrate 100, and an orthographic projection of the second blocking portion on the base substrate 100 covers the orthographic projection of the driving transistor T2 on the base substrate 100. In the first direction X, the first blocking portion protrudes from the second blocking portion. In this way, the first blocking portion may cover the entire active layer A4 of the threshold compensation transistor T4, so as to achieve a good shading effect.

Optionally, in the first shielding layer Q, the first blocking portion for shading the threshold compensation transistor T4 of the first pixel circuit D1 protrudes from the second blocking portion toward the second data line DL, and the first blocking portion for shading the threshold compensation transistor T4 of the second pixel circuit D1 protrudes from the second blocking portion toward the first data line DL.

Optionally, the first shielding layer Q may be electrically connected to the first power line VDDL. In this way, the first shielding layer Q may load DC signals, thereby the first shielding layer Q may further play an anti-crosstalk role.

In some specific embodiments, the plurality of power leads 1 include a first power lead YL and a second power lead YL2. The first power lead YL1 electrically connects at least one first power line VDDL to a first constant power terminal, and the second power lead YL2 electrically connects the second electrode of the light emitting device L to a second constant power terminal. The first constant power terminal and the second constant power terminal have different potentials. For example, the first constant power terminal may refer to the above-mentioned high-level power terminal, and the second constant power terminal may refer to the above-mentioned low-level power terminal.

In some specific embodiments, the orthographic projection of at least one power lead YL on the base substrate 100 overlaps at least partially with the orthographic projection of the at least one first power line VDDL on the base substrate 100.

Optionally, the number of first power leads YL1 and the number if second power leads YL2 may be determined according to the number of sub-pixels Px in the pixel unit P. For example, when the pixel unit P includes three sub-pixels Px, a second power lead YL2 may be provided every two first power leads YL1, which may be determined according to actual needs, and is not limited here.

For example, a pixel unit P may include three sub-pixels Px, and each of the three sub-pixels Px is electrically connected to a first power line VDDL. Two power leads YL on the left are first power leads YL1, and one power lead YL on the right is the second power lead YL2. Three first power lines VDDL are electrically connected to the two first power leads YL1, and the second power lead YL2 is electrically connected to the cathode of the light emitting device L.

In some specific embodiments, the display substrate further includes a second gate metal layer GT2 between the first gate metal layer GT1 and the first conductive layer SD1, and at least one first reset lead V11 is provided in the second gate metal layer GT2. The first electrodes of the first reset transistors T3 of a plurality of pixel circuits D adjacent in the first direction X are electrically connected to at least one first reset signal line V1 through one and same first reset lead V11.

For example, the first reset signal line V1 extends in the second direction Y, and the first reset lead V11 extends in the first direction, so that the first reset transistors T3 of the plurality of pixel circuits D adjacent in the first direction X may be electrically connected to a first reset lead V11, and is further electrically connected to one and same first reset signal line V1 through the first reset lead V11.

In some specific embodiments, the display substrate further includes an interlayer insulation layer ILD located between the second gate metal layer GT2 and the first conductive layer SD1, and the interlayer insulation layer ILD is provided with a first via hole H1 penetrating the interlayer insulation layer ILD. In the at least one pixel circuit D, the first electrode S31 of the first reset transistor T3 is electrically connected to the first reset lead V11 through the first via hole H1, and an orthographic projection of the first via hole H1 on the base substrate 100 is located on a side of an orthographic projection of the first reset lead V11 on the base substrate 100 close to the orthographic projection of the driving transistor T2 on the base substrate 100. For example, as shown in FIG. 14, the first via hole H1 is located below the first reset lead V11.

Optionally, the orthographic projection of the first via hole H1 on the base substrate 100 overlaps at least partially with the orthographic projection of the first power line VDDL on the base substrate 100.

In some specific embodiments, the display substrate further includes at least one second reset signal line V2 located in the third conductive layer SD3 and at least one third scanning signal line RE2 located in the first conductive layer SD1, and the at least one sub-pixel further includes a second reset transistor T7. In the at least one pixel circuit D, the first electrode S71 of the second reset transistor T7 is electrically connected to at least one second reset signal line V2, the second electrode S72 of the second reset transistor T7 is electrically connected to the first electrode of the light emitting device L, and the gate electrode G7 of the second reset transistor T7 is electrically connected to at least one third scanning signal line RE2. At least one second reset lead V21 is further provided in the second gate metal layer GT2, and an orthographic projection of the second reset lead V21 on the base substrate 100 is located on a side of the orthographic projection of the first reset lead V11 on the base substrate 100 close to the orthographic projection of the driving transistor T2 on the base substrate 100. The first electrodes of the second reset transistors T7 of a plurality of pixel circuits D adjacent in the first direction X are electrically connected to at least one second reset signal line V2 through one and same second reset lead V21.

For example, the second reset signal line V2 extends in the second direction Y, and the second reset lead V21 extends in the first direction. In this way, the second reset transistors T7 of the plurality of pixel circuits D adjacent in the first direction X may be electrically connected to a second reset lead V21, and is further electrically connected to one and same second reset signal line V2 through the second reset lead V21.

In some specific embodiments, the interlayer insulation layer ILD is provided with a second via hole H2 penetrating the interlayer insulation layer ILD. In the at least one pixel circuit D, the first electrode S71 of the second reset transistor T7 is electrically connected to the second reset lead V21 through the second via hole H2, and an orthographic projection of the second via hole H2 on the base substrate 100 is located on a side of the orthographic projection of the second reset lead V21 on the base substrate 100 close to the orthographic projection of the driving transistor T2 on the base substrate 100. For example, as shown in FIG. 14, the second via hole H2 is located above the second reset lead V21.

Optionally, the orthographic projection of the second via hole H2 on the base substrate 100 overlaps at least partially with the orthographic projection of the first power line VDDL on the base substrate 100.

In some specific embodiments, the display substrate further includes at least one third reset signal line V3 located in the third conductive layer SD3 and at least one third scanning signal line RE2 located in the first conductive layer SD1, and the at least one sub-pixel further includes a third reset transistor T8. In the at least one pixel circuit D, the first electrode S81 of the third reset transistor T8 is electrically connected to the at least one third reset signal line V3, the second electrode S82 of the third reset transistor T8 is electrically connected to the first electrode of the driving transistor T2, and the gate electrode G8 of the third reset transistor T8 is electrically connected to the at least one third scanning signal line RE2. At least one third reset lead V31 is provided in the second gate metal layer GT2. An orthographic projection of the third reset lead V31 on the base substrate 100 is located between the orthographic projection of the first reset lead V11 on the base substrate 100 and the orthographic projection of the second reset lead V21 on the base substrate 100. The first electrodes of the third reset transistors T8 of a plurality of pixel circuits D adjacent in the first direction X are electrically connected to the at least one third reset signal line V3 through one and same third reset lead V31.

For example, the third reset signal line V3 extends in the second direction Y, and the third reset lead V31 extends in the first direction, in this way, the third reset transistors T8 of the plurality of pixel circuits D adjacent in the first direction X may be electrically connected to a third reset lead V31, and is further electrically connected to one and same third reset signal line V3 through the third reset lead V31.

In some specific embodiments, the interlayer insulation layer ILD is provided with a third via hole H3 penetrating the interlayer insulation layer ILD. In the at least one pixel circuit D, the first electrode S81 of the third reset transistor T8 is electrically connected to the third reset lead V31 through the third via hole H3. An orthographic projection of the third via hole H3 on the base substrate 100 is located on a side of the orthographic projection of the third reset lead V31 on the base substrate 100 away from the orthographic projection of the driving transistor T2 on the base substrate 100. For example, as shown in FIG. 14, the third via hole H3 is located below the third reset lead V31.

Optionally, the orthographic projection of the third via hole H3 on the base substrate 100 overlaps at least partially with the orthographic projection of the first power line VDDL on the base substrate 100.

In some specific embodiments, the at least one data line DL includes a first portion DLa and a second portion DLb. An orthographic projection of the second portion DLb on the base substrate 100 overlaps at least partially with an orthographic projection of at least one signal line extending in the first direction X on the base substrate 100. A size of the first portion DLa in the first direction X is greater than a size of the second portion DLb in the first direction X. In other words, in embodiments of the present disclosure, an overlapping portion between the data line and other signal lines is narrowed, so that an overlapping area between signal lines may be reduced, and the parasitic capacitance may be reduced.

Optionally, in embodiments of the present disclosure, the patterns of various film layers in the first pixel circuit D1 are designed to be substantially mirror symmetrical with the patterns of various film layers in the second pixel circuit D2 about the first axis. Specifically, for one and same film layer in the first pixel circuit D1 and the second pixel circuit D2, two portions that play the same role are located on two sides of the first axis, and the two portions are located at substantially the same distance from the first axis. In this way, the parasitic capacitance on the first pixel circuit D1 is substantially the same as the parasitic capacitance on the second pixel circuit D2, and thereby a brightness difference caused by different parasitic capacitance between the two may be improved.

Referring to FIG. 21, in some specific embodiments, the display substrate further includes a first electrode layer AN located on a side of the third conductive layer SD3 away from the base substrate 100, and a first electrode AN1 of the light emitting device L of the at least one sub-pixel Px is located in the first electrode layer AN.

Optionally, the at least one pixel unit P includes a plurality of sub-pixels Px having different colors. In a pixel unit P, the first electrodes AN1 of the light emitting devices L of at least two sub-pixels Px are arranged in the second direction, and orthographic projections of the first electrodes AN1 of the light emitting devices L of at least two sub-pixels Px do not overlap with each other in the second direction.

For example, a pixel unit P includes a red sub-pixel, a green sub-pixel, and a blue sub-pixel. The first electrode AN1 of the light emitting device L of the red sub-pixel and the first electrode AN1 of the light emitting device L of the green sub-pixel are arranged in the second direction. An orthographic projection of the first electrode AN1 of the blue sub-pixel in the second direction Y does not overlap with either of an orthographic projection of the first electrode AN1 of the light emitting device L of the red sub-pixel in the second direction Y and an orthographic projection of the first electrode AN1 of the light emitting device L of the green sub-pixel in the second direction Y.

Referring to FIG. 22, in some specific embodiments, the display substrate further includes a pixel defining layer PDL located on a side of the first electrode layer AN away from the base substrate 100. The pixel defining layer PDL is provided with a plurality of pixel openings N, and an electroluminescent layer is provided in the pixel openings N. Optionally, an orthographic projection of the pixel opening N on the base substrate 100 is located in a range of the orthographic projection of the first electrode layer AN on the base substrate 100.

Referring to FIG. 23, in some specific embodiments, the display substrate further includes a third insulation layer R3 located between the first electrode layer AN and the third conductive layer SD3, and the third insulation layer R3 is provided with a plurality of via holes. For example, as shown in FIG. 24, the third insulation layer R3 is provided with a thirtieth via hole H30, and a sixth conductive portion F6 is electrically connected to the first electrode AN1 of the light emitting device L through the thirtieth via hole H30, so as to achieve an electrical connection between the second electrode S52 of the first light emission control transistor T5 and the light emitting device L.

At least some embodiments of the present disclosure further provide a display panel, including the display substrate as described above.

At least some embodiments of the present disclosure further provide a display device, including the display panel as described above.

Exemplarily, the display device may include any apparatus or product having a display function. For example, the display device may be a smart phone, a mobile phone, an e-book reader, a desktop personal computer (PC), a laptop PC, a netbook PC, a personal digital assistant (PDA), a portable multimedia player (PMP), a digital audio player, a mobile medical apparatus, a camera, a wearable apparatus (such as a head-mounted apparatus, electronic clothing, electronic bracelet, electronic necklace, electronic accessory, electronic tattoo, or smart watch), a television, etc.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate, comprising:
a base substrate;
a plurality of pixel circuits provided on the base substrate, wherein the plurality of pixel circuits are arranged in an array in a first direction and a second direction;
a plurality of groups of data lines provided on the base substrate, wherein the plurality of groups of data lines are arranged in the first direction, and at least one column of pixel circuits is electrically connected to at least one group of data lines; and
a plurality of first power lines provided on the base substrate, wherein the plurality of first power lines are arranged in the first direction, and at least one column of pixel circuits is electrically connected to at least one first power line;
wherein the at least one column of pixel circuits comprises a first pixel circuit and a second pixel circuit alternately arranged in the second direction, each of the first pixel circuit and the second pixel circuit comprises an input transistor, and the at least one group of data lines comprises a first data line and a second data line;
wherein for the at least one column of pixel circuits, the data lines electrically connected to the column of pixel circuits, and the first power line electrically connected to the column of pixel circuits, the input transistor of the first pixel circuit is electrically connected to the first data line, and the input transistor of the second pixel circuit is electrically connected to the second data line; and
wherein an orthographic projection of the first data line on the base substrate, an orthographic projection of the first power line on the base substrate and an orthographic projection of the second data line on the base substrate are arranged in sequence in the first direction, an orthographic projection of the input transistor of the first pixel circuit on the base substrate is located on a side of the orthographic projection of the first power line on the base substrate close to the orthographic projection of the first data line on the base substrate, and an orthographic projection of the input transistor of the second pixel circuit on the base substrate is located on a side of the orthographic projection of the first power line on the base substrate close to the orthographic projection of the second data line on the base substrate.

2. The display substrate according to claim 1, wherein the display substrate further comprises at least one first scanning signal line, and at least one pixel circuit in the plurality of pixel circuits further comprises a driving transistor and a storage capacitor;
   wherein in the at least one pixel circuit, a first electrode of the input transistor is electrically connected to the data line, a gate electrode of the input transistor is electrically connected to the at least one first scanning signal line, a first electrode of the driving transistor is electrically connected to a second electrode of the input transistor, a second electrode of the driving transistor is electrically connected to a first electrode of a light emitting device, a gate electrode of the driving transistor is electrically connected to a first electrode plate of the storage capacitor through a first connecting hole, and a second electrode plate of the storage capacitor is electrically connected to the first power line; and
   wherein for the at least one column of pixel circuits, the input transistor of the first pixel circuit after being translated in the second direction is mirror symmetrical with the input transistor of the second pixel circuit about a first axis, the first axis extends in the second direction, and the first connecting hole is located on the first axis.

3. The display substrate according to claim 2, wherein for the at least one column of pixel circuits, the data lines electrically connected to the column of pixel circuits, and the first power line electrically connected to the column of pixel circuits, in the first direction, the orthographic projection of the input transistor of the first pixel circuit on the base substrate is located on a side of an orthographic projection of the driving transistor of the first pixel circuit on the base substrate close to the orthographic projection of the first data line on the base substrate, and the orthographic projection of the input transistor of the second pixel circuit on the base substrate is located on a side of an orthographic projection of the driving transistor of the second pixel circuit on the base substrate close to the orthographic projection of the second data line on the base substrate.

4. The display substrate according to claim 2, wherein the display substrate further comprises at least one first reset signal line and at least one second scanning signal line, and the at least one pixel circuit further comprises a first reset transistor;
   wherein in the at least one pixel circuit, the first reset transistor comprises a first electrode electrically connected to the at least one first reset signal line, a second electrode electrically connected to the gate electrode of the driving transistor, and a gate electrode electrically connected to the at least one second scanning signal line; and
   wherein for the at least one column of pixel circuits, the first reset transistor of the first pixel circuit after being translated in the second direction is mirror symmetrical with the first reset transistor of the second pixel circuit about the first axis.

5. The display substrate according to claim 4, wherein in the at least one pixel circuit, the first electrode of the first reset transistor and the gate electrode of the first reset transistor are located on the first axis.

6. The display substrate according to claim 4, wherein the at least one pixel circuit further comprises a threshold compensation transistor, and the display substrate further comprises a first shielding layer on a side of a layer where the input transistor is located close to the base substrate, and
   wherein an orthographic projection of the first shielding layer on the base substrate covers the orthographic projection of the driving transistor of the at least one pixel circuit on the base substrate, the orthographic projection of the first reset transistor of the at least one pixel circuit on the base substrate, and the orthographic projection of the threshold compensation transistor of the at least one pixel circuit on the base substrate.

7. The display substrate according to claim 2, wherein the at least one pixel circuit further comprises a threshold compensation transistor;
   wherein in the at least one pixel circuit, the threshold compensation transistor comprises a first electrode electrically connected to the second electrode of the driving transistor, a second electrode electrically connected to the gate electrode of the driving transistor, and a gate electrode electrically connected to the first scanning signal line; and
   wherein for the at least one column of pixel circuits, the data lines electrically connected to the column of pixel circuits, and the first power line electrically connected to the column of pixel circuits, an orthographic projection of at least part of the threshold compensation transistor of the first pixel circuit on the base substrate is located between the orthographic projection of the first power line on the base substrate and the orthographic projection of the second data line on the base substrate, and an orthographic projection of at least part of the threshold compensation transistor of the second pixel circuit on the base substrate is located between the orthographic projection of the first power line on the base substrate and the orthographic projection of the first data line on the base substrate.

8. The display substrate according to claim 7, wherein the at least one pixel circuit further comprises a shielding electrode; and
   wherein for the at least one pixel circuit and the data line electrically connected to the at least one pixel circuit, an orthographic projection of the shielding electrode on the base substrate is located between the orthographic projection of the first data line on the base substrate and the orthographic projection of the threshold compensation transistor on the base substrate, and a layer where the shielding electrode is located is between a layer where the data line is located and a layer where the threshold compensation transistor is located.

9. The display substrate according to claim 7, wherein for the at least one column of pixel circuits, the threshold compensation transistor of the first pixel circuit after being translated in the second direction is mirror symmetrical with the threshold compensation transistor of the second pixel circuit about the first axis.

10. The display substrate according to claim 2, wherein the display substrate further comprises a plurality of light emission control signal lines, and the at least one pixel circuit further comprises a first light emission control transistor;
    wherein in the at least one pixel circuit, the first light emission control transistor comprises a first electrode electrically connected to the second electrode of the driving transistor, a second electrode electrically connected to the first electrode of the light emitting device, and a gate electrode electrically connected to at least one light emission control signal line in the plurality of light emission control signal lines; and wherein for the at least one column of pixel circuits, the data lines electrically connected to the column of pixel circuits, and the first power line electrically connected to the column of pixel circuits, an orthographic projection of the first light emission control transistor of the first pixel circuit on the base substrate is located between the orthographic projection of the first power line on the base substrate and the orthographic projection of the second data line on the base substrate, and an orthographic projection of the first light emission control transistor of the second pixel circuit on the base substrate is located between the orthographic projection of the first power line on the base substrate and the orthographic projection of the first data line on the base substrate.

11. The display substrate according to claim 10, wherein for the at least one column of pixel circuits, the first light emission control transistor of the first pixel circuit after being translated in the second direction is mirror symmetrical with the first light emission control transistor of the second pixel circuit about the first axis.

12. The display substrate according to claim 10, wherein at least one sub-pixel further comprises a second light emission control transistor, and in the at least one sub-pixel, the second light emission control transistor comprises a first electrode electrically connected to the at least one first power line, a second electrode electrically connected to the first electrode of the driving transistor, and a gate electrode electrically connected to the light emission control signal line; and wherein for the at least one column of pixel circuits, the second light emission control transistor of the first pixel circuit after being translated in the second direction is mirror symmetrical with the second light emission control transistor of the second pixel circuit about the first axis.

13. The display substrate according to claim 10, wherein the at least one pixel circuit further comprises a transfer portion;

wherein for the at least one pixel circuit and the first power line electrically connected to the at least one pixel circuit, the second electrode of the first light emission control transistor is electrically connected to the first electrode of the light emitting device through the transfer portion; and wherein for the at least one column of pixel circuits, the data lines electrically connected to the column of pixel circuits, and the first power line electrically connected to the column of pixel circuits, an orthographic projection of the transfer portion of the first pixel circuit on the base substrate is located on a side of the orthographic projection of the first power line on the base substrate close to the orthographic projection of the second data line on the base substrate, and an orthographic projection of the transfer portion of the second pixel circuit on the base substrate is located on a side of the orthographic projection of the first power line on the base substrate close to the orthographic projection of the first data line on the base substrate.

14. The display substrate according to claim 2, wherein the display substrate further comprises at least one second reset signal line and at least one third scanning signal line, and at least one sub-pixel further comprises a second reset transistor;

wherein in the at least one pixel circuit, the second reset transistor comprises a first electrode electrically connected to the at least one second reset signal line, a second electrode electrically connected to the first electrode of the light emitting device, and a gate electrode electrically connected to the at least one third scanning signal line; and wherein for the at least one column of pixel circuits, the data lines electrically connected to the column of pixel circuits, and the first power line electrically connected to the column of pixel circuits, an orthographic projection of the second reset transistor of the first pixel circuit on the base substrate is located between the orthographic projection of the first power line on the base substrate and the orthographic projection of the second data line on the base substrate, and an orthographic projection of the second reset transistor of the second pixel circuit on the base substrate is located between the orthographic projection of the first power line on the base substrate and the orthographic projection of the first data line on the base substrate.

15. The display substrate according to claim 14, wherein for the at least one column of pixel circuits, the second reset transistor of the first pixel circuit after being translated in the second direction is mirror symmetrical with the second reset transistor of the second pixel circuit about the first axis.

16. The display substrate according to claim 2, wherein the display substrate further comprises at least one third reset signal line and at least one third scanning signal line, and at least one sub-pixel further comprises a third reset transistor;

wherein in the at least one pixel circuit, the third reset transistor comprises a first electrode electrically connected to the at least one third reset signal line, a second electrode electrically connected to the first electrode of the driving transistor, and a gate electrode electrically connected to the at least one third scanning signal line;

wherein for the at least one column of pixel circuits, the data lines electrically connected to the column of pixel circuits, and the first power line electrically connected to the column of pixel circuits, an orthographic projection of the third reset transistor of the first pixel circuit on the base substrate is located between the orthographic projection of the first power line on the base substrate and the orthographic projection of the first data line on the base substrate, and an orthographic projection of the third reset transistor of the second pixel circuit on the base substrate is located between the orthographic projection of the first power line on the base substrate and the orthographic projection of the second data line on the base substrate; and wherein for the at least one column of pixel circuits, the third reset transistor of the first pixel circuit after being translated in the second direction is mirror symmetrical with the third reset transistor of the second pixel circuit about the first axis.

17. The display substrate according to claim 1, wherein the at least one data line comprises a first portion and a second portion, an orthographic projection of the second portion on the base substrate overlaps at least partially with an orthographic projection of at least one signal line extending in the first direction on the base substrate, and a size of the first portion in the first direction is greater than a size of the second portion in the first direction.

18. A display substrate, comprising:
a base substrate;
a plurality of pixel circuits provided on the base substrate, wherein the plurality of pixel circuits are arranged in an array in a first direction and a second direction; and a plurality of groups of data lines provided on the base substrate, wherein the plurality of groups of data lines are arranged in the first direction, at least one column of pixel circuits is electrically connected to at least one group of data lines, and different columns of pixel circuits are electrically connected to different groups of data lines;

wherein at least one pixel circuit in the plurality of pixel circuits comprises an input transistor and a driving transistor electrically connected to the input transistor, the at least one column of pixel circuits comprises a first pixel circuit and a second pixel circuit alternately arranged in the second direction, and the at least one group of data lines comprises a first data line and a second data line arranged in the first direction; and wherein for the at least one column of pixel circuits, the data lines electrically connected to the column of pixel circuits, and a first power line electrically connected to the column of pixel circuits, the input transistor of the first pixel circuit is electrically connected to the first data line, the input transistor of the second pixel circuit is electrically connected to the second data line, and in the first direction, an orthographic projection of the input transistor of the first pixel circuit on the base substrate is located on a side of an orthographic projection of the driving transistor of the first pixel circuit on the base substrate close to an orthographic projection of the first data line on the base substrate, and an orthographic projection of the input transistor of the second pixel circuit on the base substrate is located on a side of an orthographic projection of the driving transistor of the second pixel circuit on the base substrate close to an orthographic projection of the second data line on the base substrate.

19. A display panel, comprising the display substrate according to claim 1.

20. A display device, comprising the display panel according to claim 19.

* * * * *